United States Patent [19]

Kusumoto et al.

[11] Patent Number: 5,465,093
[45] Date of Patent: Nov. 7, 1995

[54] ANALOG-TO-DIGITAL CONVERTER

[75] Inventors: Keiichi Kusumoto, Osaka; Akira Matsuzawa, Yawata, both of Japan

[73] Assignee: Matsushita Electric Industrial Co., Ltd., Osaka, Japan

[21] Appl. No.: 128,654

[22] Filed: Sep. 30, 1993

[30] Foreign Application Priority Data

Oct. 1, 1992 [JP] Japan ................................. 4-263408

[51] Int. Cl.⁶ .................................................. H03M 1/06
[52] U.S. Cl. ........................ 341/122; 341/118; 341/155; 327/94
[58] Field of Search ................................. 341/118, 122, 341/155, 156, 158, 159; 327/91, 94, 95, 96

[56] References Cited

U.S. PATENT DOCUMENTS

| | | | |
|---|---|---|---|
| 4,523,107 | 6/1985 | Peterson | 327/95 |
| 4,611,196 | 9/1986 | Fernandez | 340/347 |
| 4,672,239 | 6/1987 | Thommen | 327/95 |
| 5,113,090 | 5/1992 | Imaizumi et al. | 327/91 |
| 5,381,053 | 1/1995 | Yasuda | 327/91 |

*Primary Examiner*—Howard L. Williams
*Attorney, Agent, or Firm*—Willian, Brinks, Hofer, Gilson & Lione

[57] ABSTRACT

The present invention discloses an improved analog-to-digital converter. A second sampling circuit samples the voltage difference between an analog signal and a reference voltage, before a first sampling circuit moves to a follow operation from a sample operation. Owing to pipelining by the first and second sampling circuits, even after the first sampling circuit moves to a follow operation, the difference between an analog signal and a reference voltage is still applied to a logical-level amplifier. The output of the logical-level amplifier, amplified to a logical voltage, is converted by a logic device into an A/D conversion output. Therefore, ADC differential non linearity error can be reduced.

8 Claims, 28 Drawing Sheets

OUTPUT OF ADC

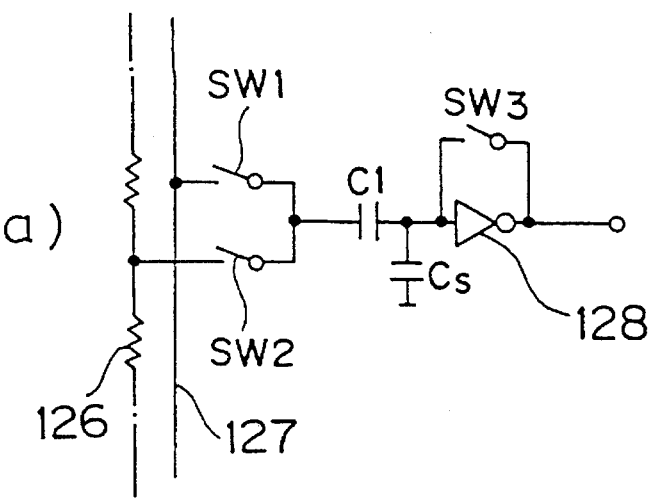
F I G.18(a)
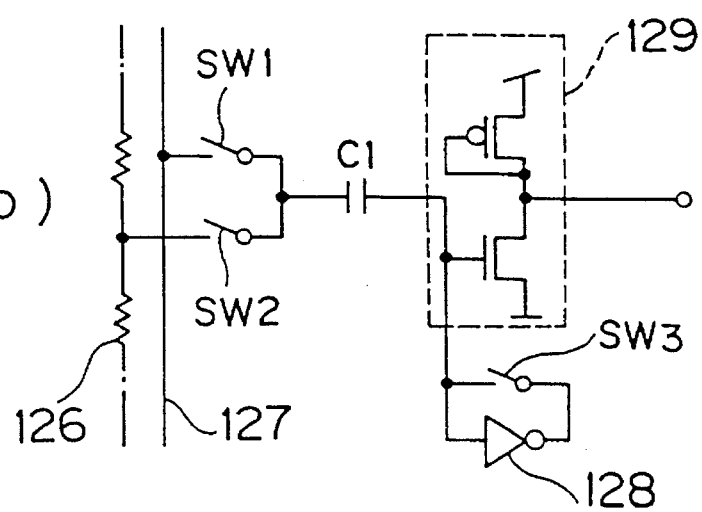
F I G.18(b)
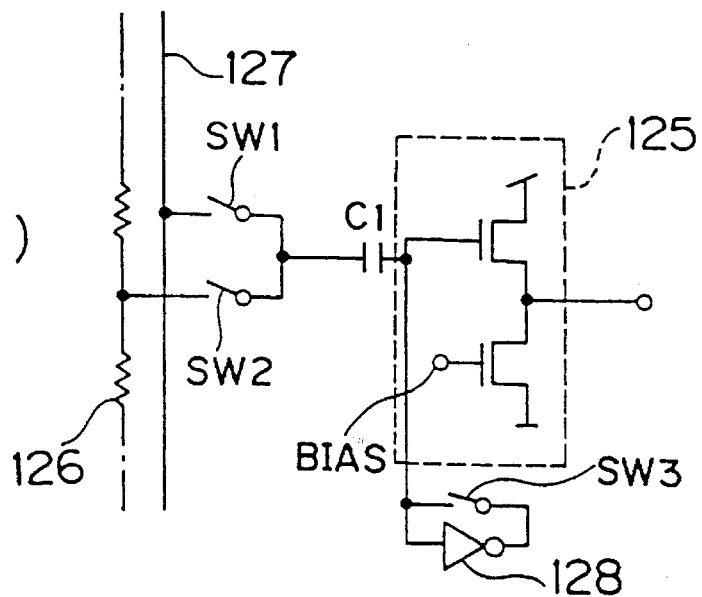
F I G.18(c)

ANALOG-TO-DIGITAL CONVERTER

FIELD OF THE INVENTION

This invention pertains to analog-to-digital converters (ADC) adopting a voltage transfer method and to ADCs adopting a capacitor interpolation method.

BACKGROUND OF THE INVENTION

For the case of an ADC capable of performing the function of quantizing an analog voltage value into a digital voltage value, conversion precision (resolution and differential non linearity error), conversion frequency, and power consumption are most important characteristics. The problems is that these characteristics conflict with one anther and thus various types of ADCs have been developed to applications.

ADCs have been finding applications in image processing, and in particular they are often applied to video cameras of a portable type for signal processing. Such a video camera (conversion frequency: in vicinity of 20 MHz for processing image sensor output signals) must be designed to operate with less power because it is battery-powered.

Referring now to FIG. 9, the organization of a conventional ADC is described. A sampling circuit 77, composed of a capacitor and a buffer circuit, samples an analog voltage. A voltage amplifier 78 amplifies the voltage difference between a sampled analog voltage and a reference voltage. Such an amplified voltage difference is amplified by a logical-level amplifier 10 to a logical-level voltage and is converted by a logic device 11 into an A/D conversion output 12.

One example of these ADCs for use in image processing equipment is shown in FIG. 11, which is a monolithic type composed of CMOS transistors. Prior to describing analog-to-digital conversion, the operation of a voltage comparator, which is one of the components of the ADC, is explained. A lower voltage comparator 96 has switches SW5, SW6, SW7, and SW8. These switches can be configured by PMOS transfer gates, by NMOS transfer gates, or by CMOS transfer gates. One of the terminals of SW6 is connected to an analog signal 1 and the other is connected to a capacitor C1. One of the terminals of SW5 is connected to a reference resistor/switch row 84 and the other is connected to one of the terminals of C1 to which SW6 is connected. The other terminal of C1 is connected to an input terminal of an inverter 82. An inverter 83 and inverter 97 are provided. These inverters including the inverter 82 can be formed by CMOS inverters, by E/D inverters, or by E/E inverters. One of the terminals of SW7 is connected to the input terminal of the inverter 82 and the other is connected to an output terminal of the Inverter 82. One of the terminals of a capacitor C2 is connected to an input terminal of the inverter 83 and the other is connected to the output terminal of the inverter 82. One of the terminals of SW8 is connected to the output terminal of the inverter 83 and the other terminal is connected to an output terminal of the inverter 83. The output terminal of the inverter 83 is connected to an input terminal of the inverter 97. This is the organization of the lower voltage comparator 96.

Next, the operation is described. FIG. 16 is a diagram with regard to the timing of SW5, SW6, SW7, and SW8. In this timing diagram, each switch is in the ON-state when a clock is at high level, whereas each switch is in the OFF-state when a clock is at low level. During the sample period, SW6, SW7, and SW8 each enter the ON-state. This connects the analog signal 1 and C1, as a result of which the voltage of the analog signal 1 is applied to one of the terminals of C1. A voltage value of $V_a$ appears at the other terminal of C1. This is explained as follows. Since SW7 is in the ON-state, voltages at the input and output terminals of the inverter 82 are $V_a$ (i.e. the voltage value at the point where the inverter input/output static characteristic curve and the straight line where the input voltage and the output voltage become the same cross) (see FIG. 19). Likewise, since SW8 is in the ON-state, voltages at the input and output terminals of the inverter 88 are $V_a$. Next, during the hold period, SW6, SW7, and SW8 are in the OFF-state. At this point, analog voltage is held at C1. In other words, the voltage across C1 becomes, at the time when the timing enters the hold period, the voltage difference between the analog voltage held and $V_a$ is held by C1.

The relationship between the storage electric charge of a parallel-plate capacitor and the terminal voltage difference is applicable to the case where the voltage difference held at Ci=the amount of electric charge Q1, then $$Q1 = C1(V_{in} - V_a) \quad (1)$$

where C1 is the value of capacitance of C1 and $V_{in}$ is the analog voltage held.

Next, at the comparison period, when SW5 enters the ON-state, the voltage difference between a voltage of $V_b$ at the input terminal of the inverter 82 and a reference voltage of $V_{ref}$ is applied across C1. Since SW7 is in the OFF-state and the input terminal of the inverter 82 is a MOS transistor gate, the input impedance is great. Thus, the entering and leaving gate currents can be ignored. Since the electric charge of the input terminal of the inverter 82 has been held since the hold period, this allows the following formula to hold:

$$Q1 = C1(V_{ref} - V_b) \quad (2)$$

where $V_{ref}$ is the reference voltage. When the formula (1) is substituted in the formula (2) so as to eliminate Q1, $V_b$ is:

$$V_b = V_{ref} - V_{in} + V_a \quad (3)$$

With regard to the input terminal of the inverter 82, $V_{ref} - V_{in}$ varies more than $V_a$. Accordingly, the output voltage of the inverter 82 (i.e. $V_{of}$) is given by:

$$V_{of} = Gf(V_{ref} - V_{in}) + V_a \quad (4)$$

$$Gf < -1$$

where Gf is the voltage gain of the inverter 82 (see FIG. 19). Also, in the inverter 83, its input voltage is amplified in the same way. Since the voltage variable from $V_a$ of the inverter 83 becomes the amount of change from $V_a$ of $V_{of}$ of the inverter 82, an output voltage of $V_{os}$ is:

$$V_{os} = Gf \cdot Gs(V_{ref} - V_{in}) + V_a \quad (5)$$

$$Gs < -1$$

where Gs is the voltage gain of the inverter 83.

The formula (5) shows that $V_{os}$ is proportional to $V_{ref} - V_{in}$, and that Gf·Gs is the proportional coefficient. In other words, the voltage difference between the reference voltage $V_{ref}$ and the sampled analog signal voltage $V_{in}$ is amplified Gf·Gs times and is output. The resulting voltage, that is, $V_{os}$ is further amplified by the inverter 97 to a logical-level voltage and then is output as a voltage comparison result.

Next, the entire ADC, shown in FIG. 11, is described. This ADC is a 5-bit series-parallel ADC with two bits for upper voltage comparison range and the remaining three bits for lower voltage comparison range. This ADC has an upper comparator row 79, formed by a group of upper voltage comparators, for comparing voltages in the upper voltage comparison range, lower comparator rows 80 and 94, each formed by a group of lower voltage comparators, for comparing voltages in the lower voltage comparison range, a reference resistor/switch row 84 capable of performing the function of applying comparison results produced by the upper comparator row 79 to the lower comparator rows 80 and 94, an upper logic device 86, lower logic devices 87 and 95, and an adder 88. Connection among these elements is described. Terminals of switches SW2 of the upper voltage comparator group are connected to capacitors C1 and the other terminals of SW2's are connected to ¼, ²⁄₄, and ¾ division points produced by dividing a reference voltage 2a and reference voltage 2b by using a reference resistor row 98. Each SW1 of the upper voltage comparator group is connected to the analog signal 1. An output terminal of the upper comparator row 79 is connected to the upper logic device 86. Each SW5 of the lower comparator row 80 is connected to switch rows 85, and 91 to 93. Each SW6 of the row 80 is connected to the analog signal 1. The lower comparator row 80 is connected to the lower logic device 87. Connection as to voltage comparators constituting the lower comparator row 94 is the same. In the switch rows 85 and 91 to 93, switches are connected to ⅛, ²⁄₈, ⅜, ⁴⁄₈, ⅝, ⁶⁄₈, ⅞ division points of the upper voltage comparison range. The upper logic device 86, lower logic device 87, and lower logic device 95 are connected to the adder 88. Further, the adder 88 sends out an A/D conversion output 89.

The operation contents of an upper voltage comparator is described in FIG. 16. FIG. 16 also shows the operation contents of a lower voltage comparator. During the sample period, SW1, SW3, and SW4 of the upper voltage comparator group, and SW6, SW7, and SW8 of the lower voltage comparator group each have an ON-state. Both the upper voltage comparator group and the lower voltage comparator group, therefore, sample analog signal voltages in common. Then, the upper voltage comparator group enter the upper comparison period, during which period SW1, SW3, and SW4 are in the OFF-state and SW2 is in the ON-state. The upper voltage comparator group output upper comparison results based on which the upper logic circuit 86 sends out either one of signals S1, S2, S3, and S4 so as to select one of the switch rows 85, 91, 92, and 93. When the upper voltage comparator group remain in the upper comparison period, the first lower voltage comparator group (i.e. the lower comparator row 80) are in the hold period and have to hold analog voltage until the upper voltage comparator group output comparison results so as to determine the lower voltage comparison range. When the lower voltage comparison range is determined, the timing now enters the lower comparison period. Then, SW5's of the first lower voltage comparator group are connected to one of the Switch rows 85, 91, 92, and 93 selected according to comparison results produced by the upper voltage comparison group. The first lower voltage comparator group output lower comparison results. The upper comparison result becomes 2-bit data at the upper logic device 86, whereas the lower comparison result becomes 3-bit data at the first lower logic device 87. The adder 88 adds these two items of data and outputs the sum, i.e. a 5-bit A/D conversion output 89.

In order to execute the above-described operation, the upper voltage comparator group carry out one-cycle conversion and thus one period of a reference clock is required. Since the lower voltage comparator group carry out conversion after the lower voltage comparator range is fixed, one cycle of a reference clock must be taken for the lower voltage comparator comparison period. As a result, the sampling of analog signal voltage is carried out before carrying out upper and lower operations. This indicates that two cycles of a reference clock is needed until the results of comparison is output. In order to output both the results of upper comparison and the results of lower comparison by one cycle of a reference clock, the additional provision of the second lower comparator row 94 is required. The first and second lower comparator rows 80 and 94 operate in turn. More specifically, when the first lower comparator row 84 enters the lower comparison period, the second lower comparison row 94 enters the sample period. Since, at this point in time, the upper comparator row 79 has already given upper comparison results used to determine the first lower comparator row's 80 lower comparison range, the upper comparator row 79 and second lower comparator row 94 sample analog signal voltages in common. The subsequent operation is the same as the operation of the upper comparator row 79, and as the operation of the first lower comparator row 80. Since two comparator rows, that is, the first and second lower comparator rows 80 and 94 operate in turn, this makes it possible to output the A/D conversion output 89 for every one period of a reference clock.

Incidentally, voltage comparator comparison precision is dependent on the threshold voltage of the change point of ADC digital output results. The drop in comparison precision results in the degradation in differential non linearity error. In order to obtain adequate comparison precision, it is important to reduce the amount of amplification by means of logical-level amplification for amplifying the voltage difference between an analog voltage and a reference voltage to a logical-level and to take a longer amplification time.

Switches SW5, SW6, SW7, and SW8, which are components of the lower voltage comparator 96, can take the form of NMOS transfer gates, of PMOS transfer gates, or of CMOS transfer gates. By the application of a clock signal (hereinafter called the switch control signal) to the gate of a MOS transistor, these transfer gates perform the function of switching between an ON-state (drain-to-source conduction) and an OFF-state (non-conduction). One of the characteristics of transfer gates is a phenomenon known as feedthrough. When a switch control signal makes a transition from ON-state voltage level to OFF-state voltage level (or from OFF-state voltage level to ON-state voltage level) due to the gate-to-drain capacitance (or gate-to-source capacitance) of a MOS transistor, it undergoes alternate current coupling and thus electric charge is implanted into the drain (or source), which is know as the feedthrough. In an operation for holding an analog input signal voltage of $V_{in}$ at the time when transition is made from the sample state to the hold state, when SW6. SW7, and SW8 make a transition to the OFF-state, electric charge is implanted or extracted into or from the connection of capacitor C1 and the inverter 82, and into or from the connection of capacitor C2 and the inverter 83. As a result, errors occur to $V_{in}$. The amount of implanted electric charge by feedthrough depends much upon the value of drain voltage (or source voltage) of MOS transistors, the gate length, the gate width, and the threshold voltage (hereinafter these being called the device parameters). The ADC requires a great number of voltage comparators, and differential non linearity error relates to the matching of device parameters. If the amounts of electric charge being implanted to voltage comparators vary due to device parameter variations, this causes holding voltages to vary. This gives rise to the degradation of differential non linearity error. It is already described that the degradation of differential non linearity error occurs even in a single lower comparator row due to holding voltage variations. For the case of employing two lower comparator rows (FIG. 11), holding voltage variation occurs even between the two rows. A further problem arises that the degradation of differential non linearity error becomes more serious. Since holding voltage error due to feedthrough degrades the voltage comparison precision of a group of voltage comparators, this determines minimum voltage comparison range thereby determining the limit of ADC resolution. Further, since all of the three inverters used in a voltage comparator are biased to $V_a$ during the sample period as well as during the hold period, this increases the total amount of passing-through current (see FIG. 19). As a result, consumption power becomes increased.

DISCLOSURE OF THE INVENTION

Bearing in mind the above-described problems existing in the prior art techniques, the present invention was made. It is a main object of the present invention to alleviate the degradation of differential non linearity error caused by device parameter variations. It is another object of the present invention to improve the minimum comparison voltage range of ADCs so as to rectify the limit of ADC resolution, whereby the reduction of consumption power is achievable.

The present invention discloses a first ADC. The first ADC has a first sampling circuit and a second sampling circuit. The first sampling circuit follows an analog signal while holding it and outputs the voltage difference between such a holding voltage and a reference voltage. The second sampling circuit follows the voltage difference between the aforesaid holding voltage and a reference voltage and holds it. Because of such arrangement, even if the first sampling circuit follows an analog signal, the voltage difference between a holding voltage of an analog signal and a reference voltage can be held for a longer time owing to the second sampling circuit holding operation. In other words, the voltage difference between an analog voltage and a reference voltage is transferred from a sampling circuit at one stage to another sampling circuit at the next stage by means of pipelining, in order to prolong voltage difference holding time. This is used as a comparison signal of an ADC and thus differential non linearity error can be reduced.

The present invention discloses a second ADC. In accordance with the second ADC, two neighboring sampling circuits output A1 ($V_{r1}-V_{in}$) and A1 ($V_{r2}-V_{in}$), respectively, the former being the voltage difference between a reference voltage $V_{r1}$ and a sampled analog input voltage $V_{in}$ and the latter being the voltage difference between a reference voltage $V_{r2}$ and $V_{in}$ ($V_{r1}<V_{r2}$ and A1 is the voltage gain). These output voltages are amplified by respective downstream voltage amplifiers (the degree of voltage amplification: 2) to A1·A2 ($V_{r1}-V_{in}$) and A1·A2 ($V_{r2}-V_{in}$), and meanwhile, they are sampled with capacitors and amplifiers (the degree of voltage amplification: 2) for averaging. Then, a voltage of A1 A2 $\{(V_{r2}+V_{r1})/2-V_{in}\}$ as a result of amplifying the intermediate voltage between A1 ($V_{r1}-V_{in}$) and A1 ($V_{r2}-V_{in}$) is output. By connecting in parallel two circuits for amplifying the output voltages of upstream amplifiers with a circuit formed by capacitors and voltage amplifiers so as to amplify the intermediate voltage between such output voltages of the upstream amplifiers, it is possible to amplify the voltage difference between an analog voltage and each division point of adjoining reference voltages. The number of sampling circuits and the number of voltage comparators can be reduced, as a result of which the resolution is improved and differential non linearity error is reduced. Low-power ADCs are realized.

The present invention discloses a third ADC. In accordance with the third ADC, voltage comparators, formed by a capacitor, switch, and inverter, are cascade-connected with one another. A voltage comparator at one stage makes a comparison thereby outputting a comparison voltage. Such a comparison voltage is sampled by another voltage comparator at the next stage. Further, a voltage comparator at one stage executes the operation of sampling whereby the output voltage becomes $V_a$, so that a voltage comparator at the next stage makes a comparison using $V_a$. In other words, a voltage comparison result, produced by a voltage comparator at one stage, is sampled by a voltage comparator at the next stage, thereafter being transferred by means of pipelining (i.e. comparison operation) to a further voltage comparator. Because of this, the number of lower comparator rows can be reduced to a single row (conventionally, two rows are required). Conventional series-parallel ADCs with two voltage comparator rows suffer from the variation in threshold voltage between voltage comparator rows. The present invention eliminates such a problem thereby being free from the drop in comparison precision. Differential non linearity is improved. Further, compared to conventional techniques, dead band time becomes shorter and thus the rate of conversion is improved. Furthermore, the reduction of consumption power is achievable.

The present invention discloses a fourth ADC. In accordance with the fourth ADC, capacitors are connected between output terminals of neighboring upstream voltage comparators and input terminals of downstream voltage comparators arranged between such neighboring upstream voltage comparator rows. Because of this arrangement, the output voltages of the neighboring upstream voltage comparators are divided by the capacitors. The downstream voltage comparator makes a comparison by using such a divided voltage and thus the number of voltage comparators at an upstream stage can be reduced. Consumption power can be reduced. Further, since the amplified output voltage of a voltage comparator at one stage is used by a voltage comparator at the next stage for comparison purpose, the effects of feedthrough is alleviated and thus the upstream voltage comparator causes less comparison errors. Further, voltage comparators used for voltage division by capacitors are connected in series, which improves ADC resolution. To sum up, ADC resolution is improved and differential non linearity error is reduced. The reduction of consumption power is possible.

BRIEF DESCRIPTION OF THE DRAWINGS

In the drawings:

FIG. 18a shows a voltage amplifier capable of the setting of voltage gain by capacitance ratio;

FIG. 18b shows a voltage amplifier capable of the setting of voltage gain by mutual conductance ratio;

FIG. 18c shows a voltage comparator whose input voltage to output voltage ratio is 1:1;

DESCRIPTION OF THE PREFERRED EMBODIMENTS

By reference to the accompanying drawings, different ADCs in accordance with the present invention are now described below.

Example 1

Figure 1:
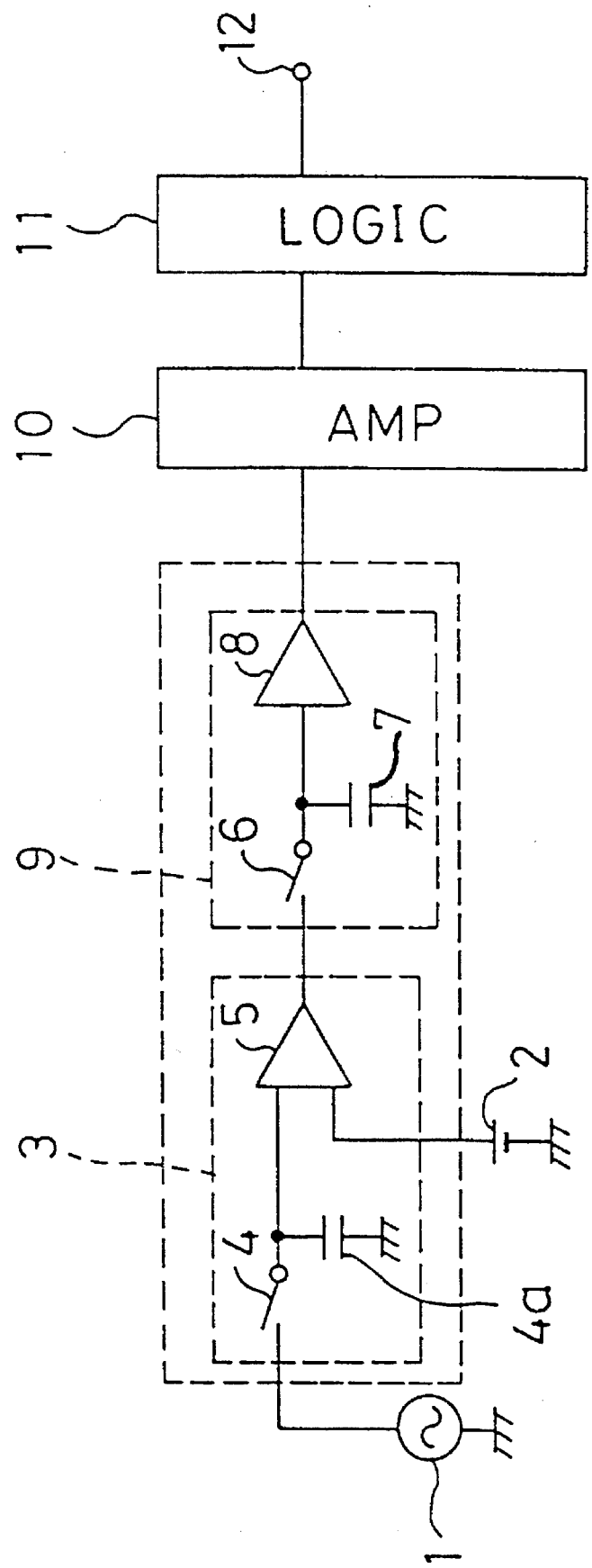
FIG. 1 is a first ADC of the present invention.

Referring now to FIG. 1, the organization of a first ADC of a voltage transfer type is described. A first sampling circuit 3 has a holding capacitor 4a, switch 4, and buffer circuit 5. A first terminal of the holding capacitor 4a is connected to the earth. A second terminal of the holding capacitor 4a is connected to a second terminal of the switch 4 whose first terminal is connected to an analog signal 1. A first input terminal of the buffer circuit 5 is connected to a connection at which the second terminal of the switch 4 and the second terminal of the holding capacitor 4a are interconnected. A second terminal of the buffer circuit 5 is connected to a reference voltage 2. An output terminal of the buffer circuit 5 is connected to a first terminal of a switch 6 that also serves as an input terminal of a second sampling circuit 9. In addition to the switch 6, the second sampling circuit 9 has a holding capacitor 7 and buffer circuit 8. A second terminal of the switch 6 and a second terminal of the holding capacitor whose first terminal is connected to the earth are connected to an input terminal of the buffer circuit 8. An output terminal of the buffer circuit 8 is connected to an input terminal of a logical-level amplifier 10. An output terminal of the logical-level amplifier 10 is connected to an input terminal of a logic device 11. An A/D conversion output is represented by reference numeral 12.

The operation of the first ADC is explained. The analog signal 1 is sampled by the first sampling circuit 3. The output of the second sampling circuit 9 varies with the voltage difference between such a sampled analog voltage (i.e. the output voltage of the first sampling circuit 3) and the reference voltage 2. Before the first sampling circuit 3 moves to a follow operation from a sample operation, the second sampling circuit 9 samples the output voltage of the first sampling circuit 3. This ensures that the voltage difference between the analog signal 1 and the reference voltage 2 is still applied to the logical-level amplifier 10, even after the first sampling circuit 3 has moved into a follow operation. Having been amplified to a logical-level voltage, the output of the logical-level amplifier 10 is converted by the logic device 11 into the A/D conversion output 12.

The present example achieves a higher amplification precision compared to the prior art techniques, since the present example allows the logical-level amplifier 10 to take a longer amplification time for its voltage amplification operation. This results in the reduction in differential non linearity error.

Example 2

Figure 2:
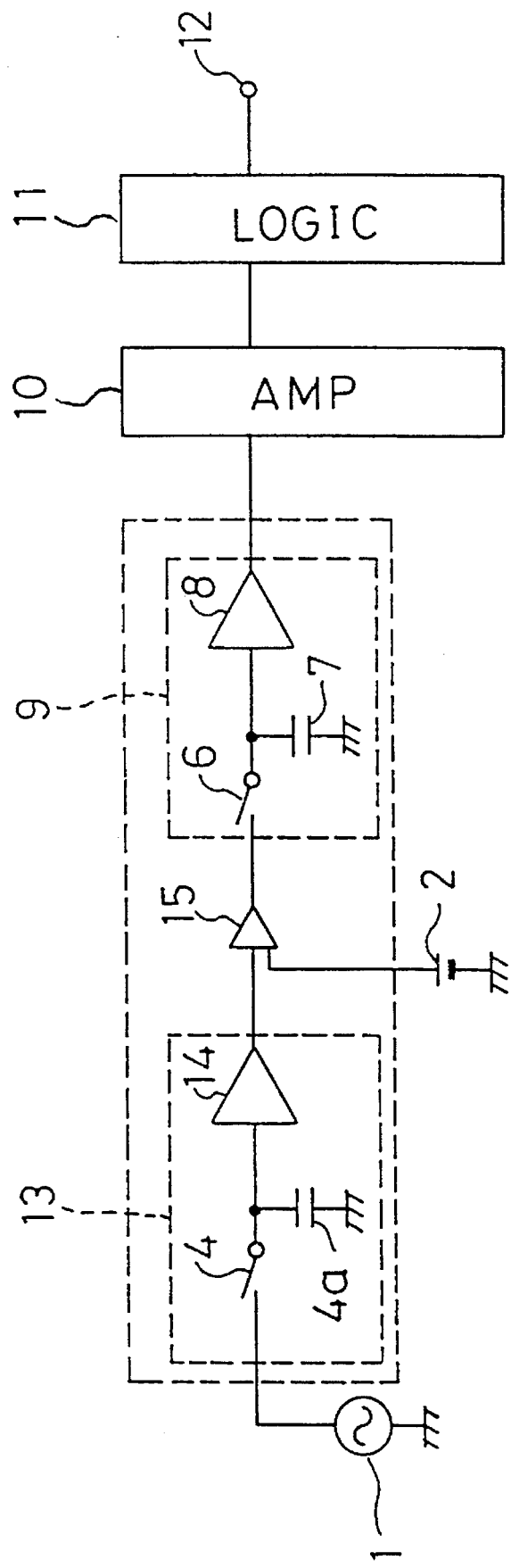
FIG. 2 is a second ADC of the present invention.

Referring now to FIG. 2, the organization of a second ADC of a voltage transfer type is described. A first sampling circuit 13 has a holding capacitor 4a, switch 4, and buffer circuit 14. A first terminal of the holding capacitor 4a is connected to the earth. A second terminal of the holding capacitor 4a is connected to a second terminal of the switch 4 whose first terminal is connected to an analog signal 1. An input terminal of the buffer circuit 14 is connected to a connection at which the second terminal of the switch 4 and the second terminal of the holding capacitor 4a are interconnected. An output terminal of the buffer circuit 14 is connected to a first terminal of a voltage amplifier 15 whose second terminal is connected to a reference voltage 2. An output terminal of the voltage amplifier 15 is connected to a first terminal of a switch 6 that also serves as an input terminal of a second sampling circuit 9 which is identical in configuration with its counterpart in the first example. The second ADC further includes a logical-level amplifier 10 and a logical device 11 which are identical in configuration with their counterparts in the first example.

The operation of the second ADC is explained. The analog signal 1 is sampled by tile first sampling circuit 13. The voltage amplifier 15 amplifies the voltage difference between such a sampled analog voltage (i.e. the output voltage of the first sampling circuit 13) and the reference voltage 2 and outputs the amplified voltage difference. The output of the second sampling circuit 9 varies with the amplified voltage difference that is the output of the voltage amplifier 15. Before the first sampling circuit 13 moves to a follow operation from a sample operation, the second sampling circuit 9 samples the output voltage of the voltage amplifier 15. This ensures that the voltage difference between the analog signal 1 and the reference voltage 2 is still applied to the logical-level amplifier 10, even after the first sampling circuit 13 has moved into a follow operation. Having been amplified to a logical-level voltage, the output of the logical-level amplifier 10 is converted by the logic device 11 into the A/D conversion output 12.

The present example achieves a higher amplification precision compared to the prior art techniques, since the present example not only allows the logical-level amplifier 10 to take a longer amplification time for its voltage amplification operation, but also divides voltage amplification work between the voltage amplifier 15 and the logical-level amplifier 10. This leads to the reduction of differential non linearity error.

Example 3

Figure 3:
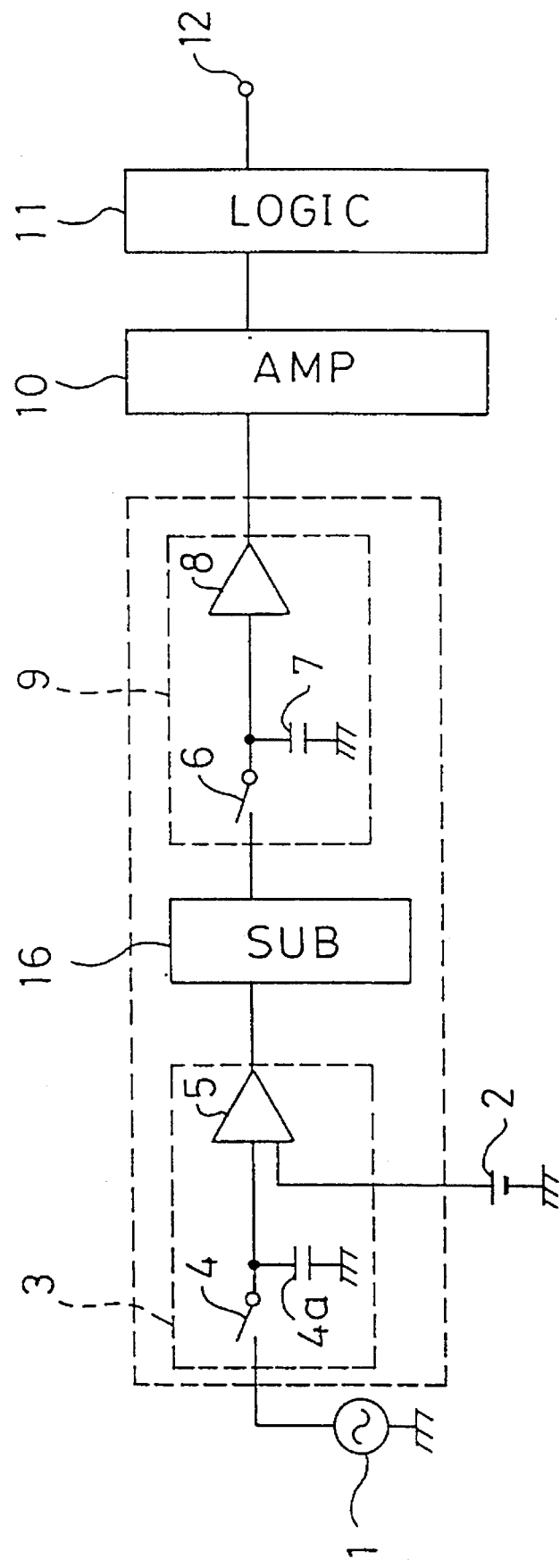
FIG. 3 is a third ADC of the present invention.

Referring now to FIG. 3, the organization of a third ADC of a voltage transfer type is described. As seen from FIG. 3, the third ADC is identical in configuration with the first ADC except that a subtracter 16 is inserted between an output terminal of a first sampling circuit 3 and an input terminal of a second sampling circuit 9. The subtracter 16 subtracts offset voltage.

The present example achieves a higher amplification precision compared to the prior art techniques, since the present example not only allows a logical-level amplifier 10 to take a longer amplification time for its voltage amplification operation, but also employs the subtracter 16 so as to remove offset voltage generated to the output of the first sampling circuit 3. This leads to the reduction of differential non linearity error.

Example 4

Figure 4:
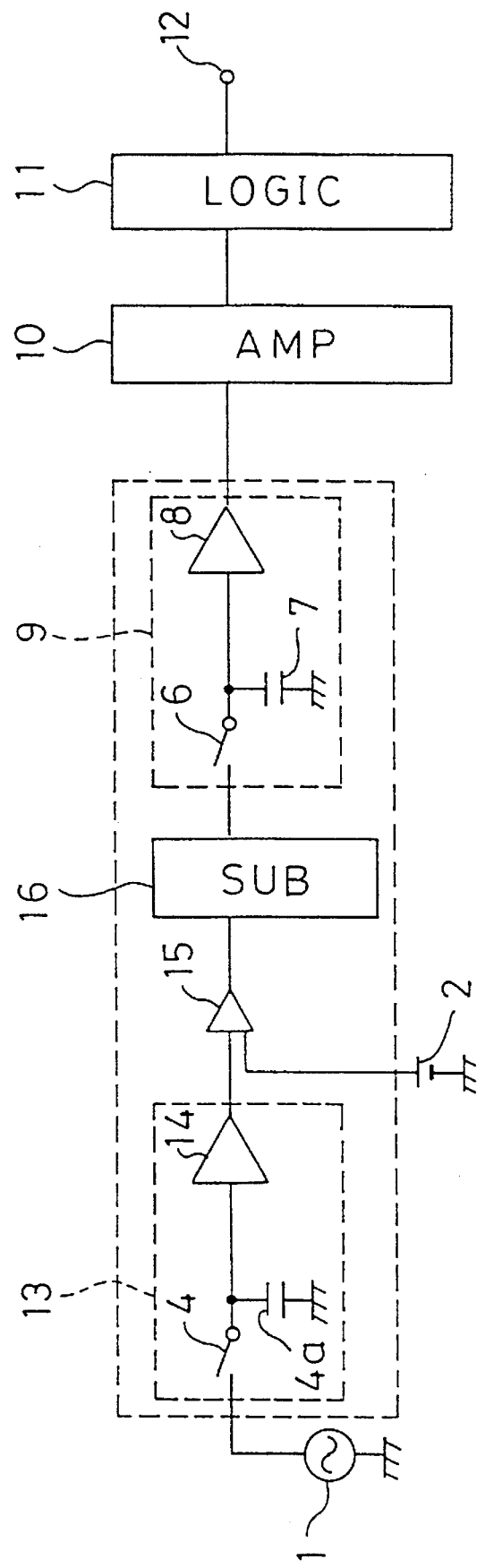
FIG. 4 is a fourth ADC of the present invention.

Referring now to FIG. 4, the organization of a fourth ADC of a voltage transfer type is described. As seen from FIG. 4, the third ADC is identical in configuration with the second ADC except that a subtracter 16 is inserted between an output terminal of a voltage amplifier 15 and an input terminal of a second sampling circuit 9. The subtracter 16 subtracts offset voltage.

The present example achieves a higher amplification precision compared to the prior art techniques, since the present example allows a logical-level amplifier 10 to take a longer amplification time for its voltage amplification operation, divides voltage amplification work between the voltage amplifier 15 and a logical-level amplifier 10, and employs the subtracter 16 so as to remove offset voltage generated to the output of the voltage amplifier 15. This leads to the reduction of differential non linearity error.

Example 5

Figure 5:
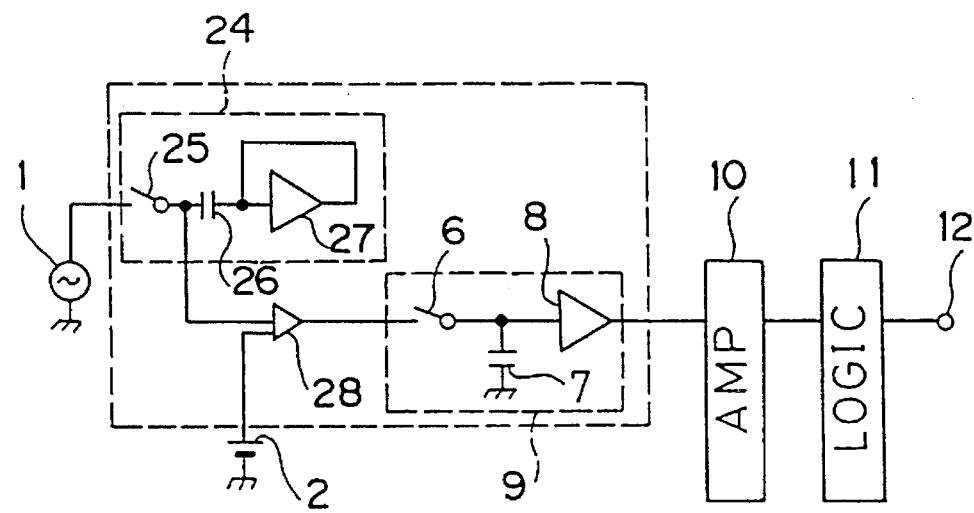
FIG. 5 is a fifth ADC of the present invention.

Referring now to FIG. 5, the organization of a fifth ADC of a voltage transfer type is described. A first sampling circuit 24 has a switch 25, a holding capacitor 26, a first voltage amplifier 27 whose input and output terminals are short-circuited. An output terminal of the first sampling circuit 24, or a connection at which the switch 25 and the holding capacitor 26 are interconnected, is connected to a first terminal of a second voltage amplifier 28 whose second terminal is connected to a reference voltage 2. An output terminal of the second voltage amplifier 28 is connected to an input terminal of a second sampling circuit 9 which is the same configuration as that of the second sampling circuit 9 of the first example. The fifth ADC further includes a logical-level amplifier 10 and a logic device 11 which are identical in configuration with their counterparts in the first example.

The operation of the fifth ADC is explained. The first sampling circuit 24 holds in the holding capacitor 26 the voltage difference between the bias voltage of the first voltage amplifier 27 biased when short circuiting takes place between its input and output terminals and the analog signal voltage so as to sample the analog signal 1. The second voltage amplifier 28 amplifies the voltage difference between such a sampled analog voltage (i.e. the output voltage of the first sampling circuit 24) and the reference voltage 2 and outputs the amplified voltage difference. The output of the second sampling circuit 9 varies with the amplified voltage difference which is the output of the second voltage amplifier 28. Before the first sampling circuit 24 moves to a follow operation from a sample operation, the second sampling circuit 9 samples the output voltage of the second voltage amplifier 28. This ensures that the aforesaid amplified voltage difference is still applied to the logical-level amplifier 10, even after the first sampling circuit 24 has moved into to a follow operation. Having been amplified to a logical-level voltage, the output of the logical-level amplifier 10 is converted by the logic device 11 into the A/D conversion output 12.

The present example achieves a higher amplification precision compared to the prior art techniques, since the present example not only allows the logical-level amplifier 10 to take a longer amplification time for its voltage amplification operation, but also divides voltage amplification work between the second voltage amplifier 28 and the logical-level amplifier 10. This leads to the reduction of differential non linearity error.

Example 6

Figure 6:
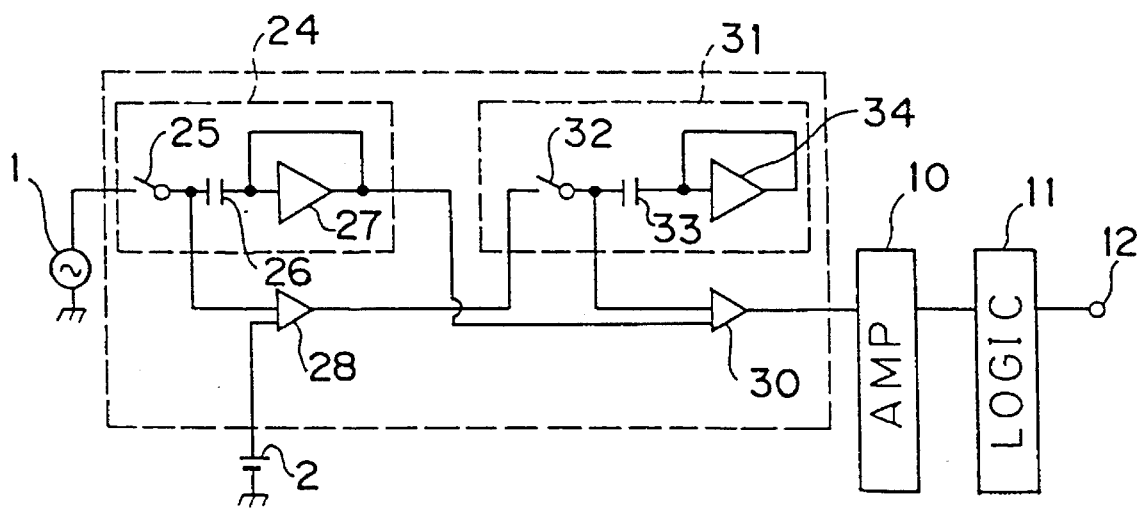
FIG. 6 is a sixth ADC of the present invention.

Referring now to FIG. 6, the organization of a sixth ADC of a voltage transfer type is described. A first sampling circuit 24 has a switch 25, a holding capacitor 26, a first voltage amplifier 27 whose input and output terminals are short-circuited. An output terminal of the first sampling circuit 24, or a connection at which the switch 25 and the holding capacitor 26 are interconnected, is connected to a first terminal of a second voltage amplifier 28 whose second terminal is connected to a reference voltage 2. The output voltage of the second voltage amplifier 28 is applied to a second sampling circuit 31. Like the first sampling circuit 24, the second sampling circuit 31 has a switch 32, a holding capacitor 33, and a third voltage amplifier 34 whose input and output terminals are short-circuited. An output terminal of the second sampling circuit 31, or a connection at which the switch 32 and the holding capacitor 33 are interconnected, is connected to a first terminal of a fourth voltage amplifier 30 whose second terminal is connected to the output terminal of the first voltage amplifier 27. An output terminal of the fourth voltage amplifier 30 is connected to an input terminal of a logical-level amplifier 10. An output terminal of the logical-level amplifier 10 is connected to an input terminal of a logic device 11. An A/D conversion output is indicated by reference numeral 12.

The operation of the sixth ADC is explained. The first sampling circuit 24 holds in the holding capacitor 26 the voltage difference between the bias voltage of the first voltage amplifier 27 biased when short circuiting takes place between its input and output terminals and the analog signal voltage so as to sample the analog signal 1. The second voltage amplifier 28 amplifies the voltage difference between such a sampled analog voltage (i.e. the output voltage of the first sampling circuit 24) and the reference voltage 2 and outputs the amplified voltage difference. That is, the input voltage of the second sampling circuit 31 varies with the voltage difference between the analog signal 1 and the reference signal 2. The second sampling circuit 31 holds in the holding capacitor 33 the voltage difference between the bias voltage of the third voltage amplifier 34 biased when short circuiting takes place between its input and output terminals and the output voltage of the second voltage amplifier 28 so as to sample the output voltage of the second voltage amplifier 28 before the first sampling circuit 24 moves to a follow operation from a sample operation. The fourth voltage amplifier 30 amplifies a voltage as a result of subtracting the bias voltage of the first voltage amplifier 27 from the output voltage of the second sampling circuit 31, and outputs the result. This ensures that the amplified voltage difference is still applied to the logical-level amplifier 10, even after the first sampling circuit 24 has moved into a follow operation. Having been amplified to a logical-level voltage, the output of the logical-level amplifier 10 is converted by the logic device 11 into the A/D conversion output 12.

The present example achieves a higher amplification precision compared to the prior art techniques, since the present example not only allows the logical-level amplifier 10 to take a longer amplification time for its voltage amplification operation, but also divides voltage amplification work among the second voltage amplifier 28, the fourth voltage amplifiers 30, and the logical-level amplifier 10. This leads to the reduction of differential non linearity error.

Example 7

Figure 7:
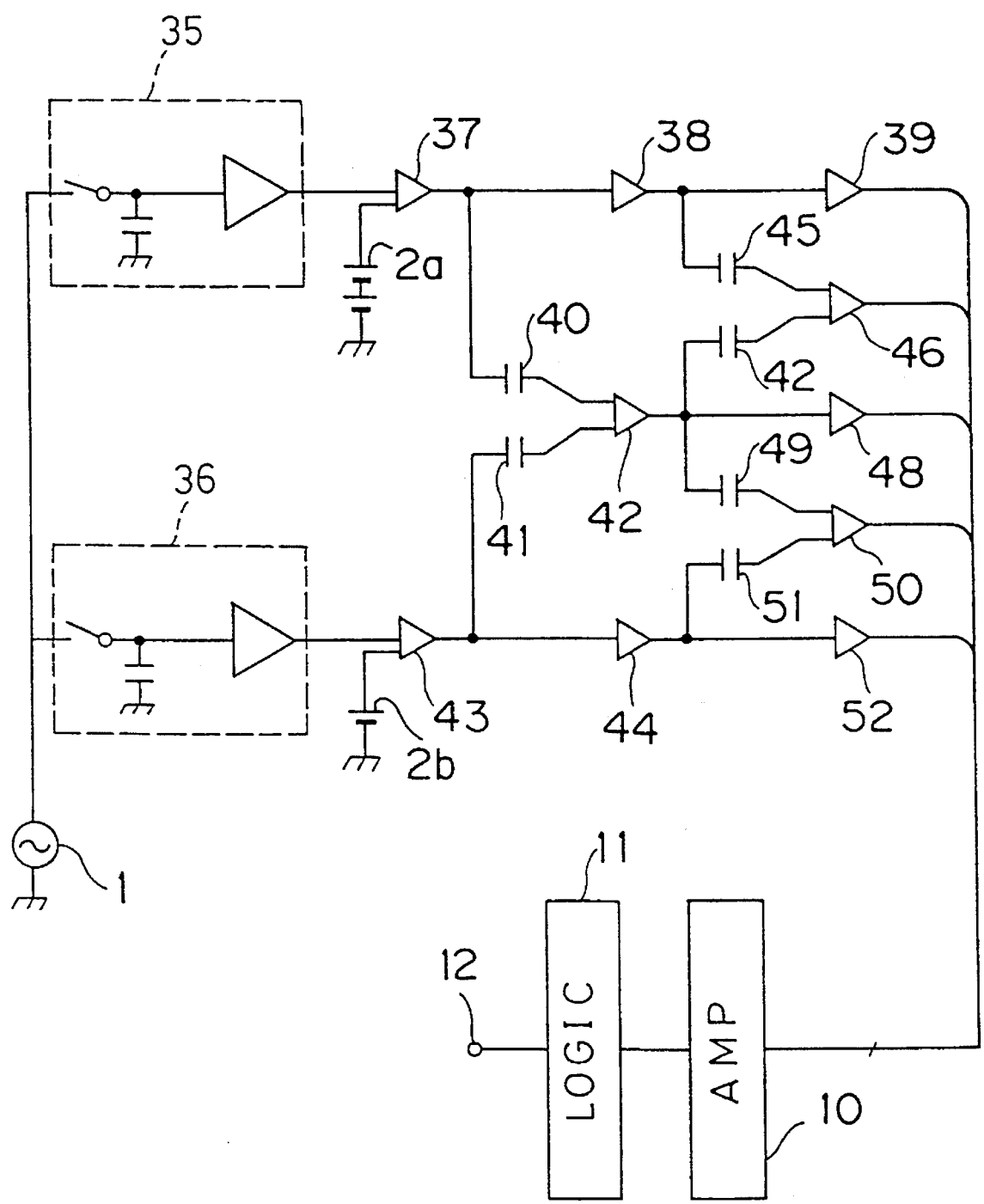
FIG. 7 is a seventh ADC of the present invention.

Referring now to FIG. 7, the organization of a seventh ADC that employs the method of interpolation with capacitors is described. A sampling circuit 35 has two terminals, one of which (i.e. an input terminal) is connected to an analog signal 1 and the other of which (i.e. an output terminal) is connected to a first terminal of a voltage amplifier 37 whose second terminal is connected to a first reference voltage 2a. A sampling circuit 36 has two terminals, one of which (i.e. an input terminal) is connected to the analog signal 1 and the other of which (i.e. an output terminal) is connected to a first terminal of a voltage amplifier 43 whose second terminal is connected to a second reference voltage 2b. An output terminal of the voltage amplifier 37 is connected to a connection where an input terminal of a voltage amplifier 38 and a first terminal of an interpolation capacitor 40 whose second terminal is connected to a first terminal of a voltage amplifier 42 are interconnected. An output terminal of the voltage amplifier 43 is connected to an input terminal of a voltage amplifier 44 as well as to a first terminal of an interpolation capacitor 41 whose second terminal is connected to a second terminal of the voltage amplifier 42. An output terminal of the voltage amplifier 38 is connected to an input terminal of a voltage amplifier 39 as well as to a first terminal of an interpolation capacitor 45 whose second terminal is connected to a first terminal of a voltage amplifier 46. An output terminal of the voltage amplifier 42 is connected to an input terminal of a voltage amplifier 48, to a first terminal of an interpolation capacitor 47 whose second terminal is connected to a second terminal of the voltage amplifier 46, and to a first terminal of an interpolation capacitor 49 whose second terminal is connected to a first terminal of a voltage amplifier 50. An output terminal of the voltage amplifier 44 is connected to an input terminal of a voltage amplifier 52 as well as to a first terminal of an interpolation capacitor 51 whose second terminal is connected to a second terminal of the voltage amplifier 50. Output terminals of the voltage amplifiers 39, 46, 48, 50, and 52 are connected to an input terminal of a logical-level amplifier 10 whose output terminal is connected to an input terminal of a logic device 11. An A/D conversion output is indicated by reference numeral 12.

The operation of the seventh ADC is described. The sampling circuit 35 samples $V_{in}$ which is an analog voltage, and $V_{r1}-V_{in}$ (i.e. the voltage difference between such a sampled analog voltage and the first reference voltage 2a having a voltage value of $V_{r1}$) is amplified by the voltage amplifier 37 (the degree of voltage amplification: A1) to A1 ($V_{r1}-V_{in}$). Also, the sampling circuit 36 samples $V_{in}$ which is an analog voltage, and $V_{r2}-V_{in}$ (i.e. the voltage difference between such a sampled analog voltage and the second reference voltage 2b having a voltage value of $V_{r2}$ ($>V_{r1}$) is amplified by the voltage amplifier 43 (the degree of voltage amplification: A1) to A1 ($V_{r2}-V_{in}$). The voltages of A1 ($V_{r1}-V_{in}$) and A1 ($V_{r2}-V_{in}$) are equally divided by the interpolation capacitors 40 and 41 respectively so as to produce A1 $\{(V_{r2}+V_{r1})/2-V_{in}\}$. Such an equally divided voltage is amplified by the voltage amplifier 42 (the degree of voltage amplification: A2) to A1·A2 $\{(V_{r2}+V_{r1}/2-V_{in}\}$. In other words, the voltage amplifier 42 amplifies the voltage difference between $V_{in}$ (i.e. the sampled analog voltage) and ($V_{r2}+V_{r1}$) (i.e. the intermediate voltage between the first reference voltage 2a and the second reference voltage 2b), which indicates that the intermediate voltage between the first reference voltage and the second reference voltage is produced by the interpolation capacitors 40 and 41. Likewise, the voltage difference between $3 \cdot V_{r2}/4+V_{r1}/4$ (i.e. the intermediate voltage between $V_{r2}$ serving as a second reference voltage and ($V_{r1}+V_{r2})/2$) and the sampled analog voltage is amplified to A1·A2·A3 $((3\ V_{r2}+V_{r1}))/4-V_{in}\}$ by the voltage amplifier 46 (the degree of voltage amplification: A3) via the interpolation capacitors 45 and 47. The voltage difference between ($V_{r2}+3 \cdot V_{r1}$)/4 (i.e. the intermediate voltage between ($V_{r2}+V_{r1}$))/2 and $V_{r1}$ serving as a first reference voltage) and the sampled analog voltage is amplified to A1·A2·A3 $\{(V_{r2}+3 \cdot V_{r1}))/4-V_{in}\}$ by the voltage amplifier 50 (the degree of voltage amplification: A3) via the interpolation capacitors 49 and 51. The voltage amplifier 39 (the degree of voltage amplification: A3) amplifies the output voltage of the voltage amplifier 38 to A1·A2·A3 ($V_{r1}-V_{in}$). Likewise, the voltage amplifier 48 (the degree of voltage amplification: A3) amplifies the output voltage of the preceding voltage amplifier to A1·A2·A3 $\{(V_{r2}+V_{r1})/2-V_{in})$, and the voltage amplifier 52 (the degree of voltage amplification: A3) amplifies the output voltage of the preceding voltage amplifier to the A1·A2·A3 ($V_{r2}-V_{in}$). The output voltages of the voltage amplifiers 39, 46, 48, 50, and 52 are voltage-amplified by the logical-level amplifier 10 to logical-level voltages and then are converted by the logic device 11 into the A/D conversion output 12.

The present example reduces the number of voltage amplifiers thereby achieving low-power ADCs, since voltage points as a result of equal division between the first reference voltage and the second reference voltage are produced by interpolation capacitors that are connected between output terminals of first-stage sampling circuits as well as by other interpolation capacitors that are connected between output terminals of first-stage voltage amplifiers.

Example 8

Figure 8:
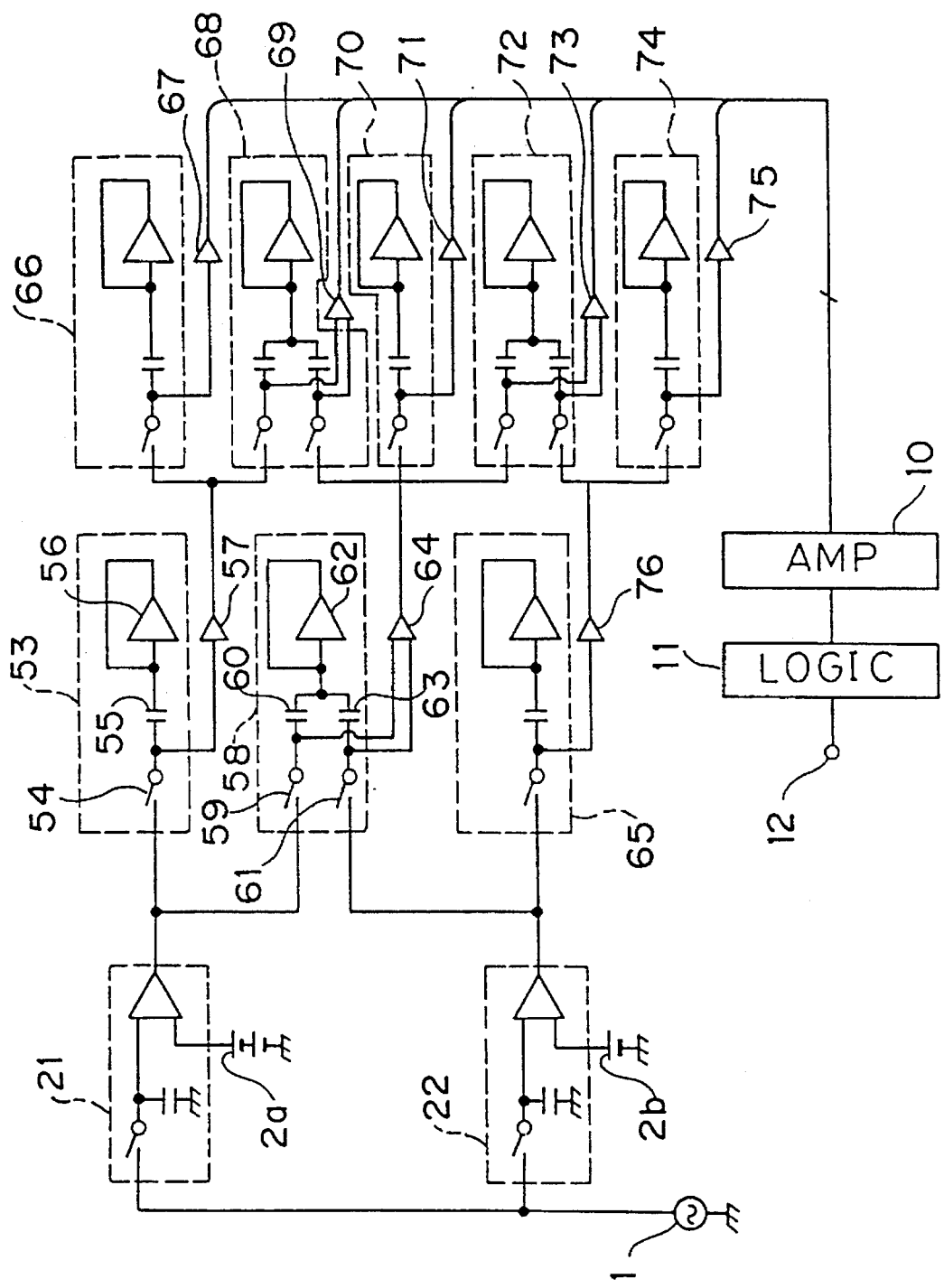
FIG. 8 is an eighth ADC of the present invention.
Figure 9:
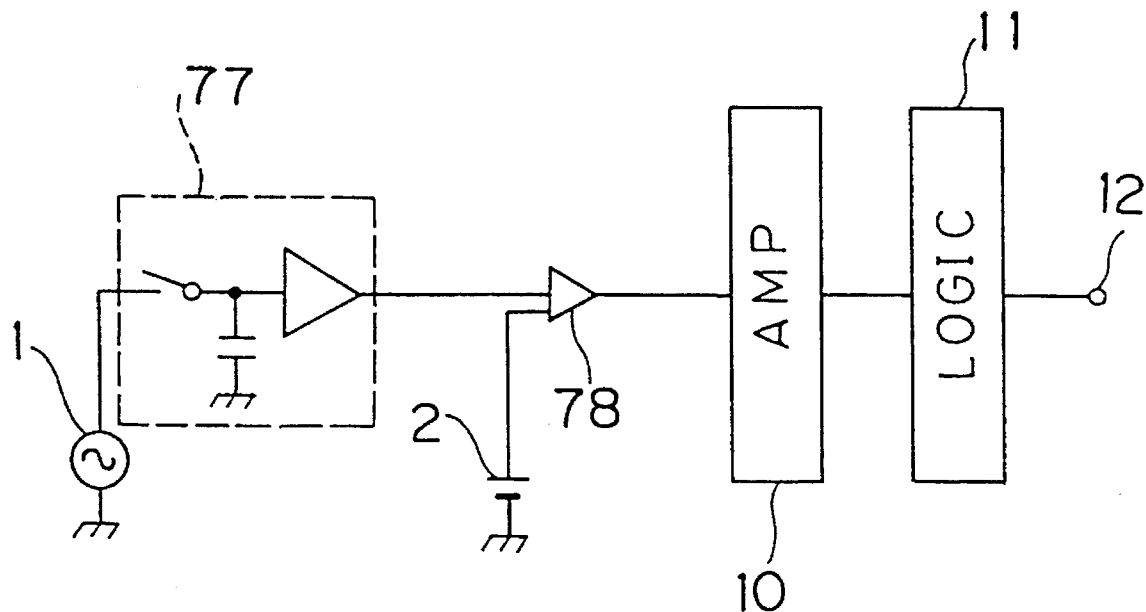
FIG. 9 is a conventional ADC.

Referring now to FIG. 8, the organization of an eighth ADC which employs a voltage transfer method as well as a interpolation method by capacitors. An output terminal of a sampling circuit 21 is connected to an input terminal of a sampling circuit 53 as well as to a first input terminal of a sampling circuit 58. An output terminal of a sampling circuit 22 is connected to an input terminal of a sampling circuit 65 as well as to a second input terminal of the sampling circuit 58. The sampling circuit 53 has a switch 54, a holding capacitor 55, a voltage amplifier 56 that produces a bias voltage when there occurs short circuiting between its input and output terminals. The sampling circuit 53 has the function of sampling the difference between tile bias voltage and the input voltage with the help of the holding capacitor 55. The sampling circuit 65 is identical in configuration with the sampling circuit 53. The sampling circuit 58 has a switch 59, a switch 61, a holding capacitor 60, a holding capacitor 63, and a voltage amplifier 62 that produces a bias voltage when its input and output terminals are short-circuited. The voltage difference between the bias voltage and the input voltage applied to the first input terminal of the voltage amplifier 58 is sampled by the holding capacitor 60, whereas the voltage difference between the bias voltage and the input voltage applied to the second input terminal of the voltage amplifier 58 is sampled by the holding capacitor 63. A voltage amplifier 57 is connected between an output terminal of the voltage amplifier 53, an input terminal of a sampling circuit 66, and a first terminal of a sampling circuit 68. A voltage amplifier 64 is connected between an output terminal of the voltage amplifier 58, a second input terminal of the sampling circuit 68, an input terminal of a sampling circuit 70, and a first input terminal of a sampling circuit 72. A voltage amplifier 76 is connected between an output terminal of the sampling circuit 65, a second input terminal of the sampling circuit 72, and an input terminal of a sampling circuit 74. The sampling circuits 66, 68, 70, 72, and 74 have output terminals that are connected to input terminals of voltage amplifiers 67, 69, 71, 73, and 75. The voltage amplifiers 67, 69, 71, 73, and 75 have output terminals that are connected to an input terminal of a logical-level amplifier 10 whose output terminal is connected to an input terminal of a logic device 11. An A/D conversion output is indicated by reference numeral 12.

The operation of the eighth ADC is described. The sampling circuit 21 delivers the voltage difference between $V_{in}$ (sampled analog voltage) and a first reference voltage 2a having a voltage value of $V_{r1}$. That is, the sampling circuit 21 outputs $V_{r1}-V_{in}$. The sampling circuit 22 delivers the voltage difference between $V_{in}$ (sampled analog voltage) and a second reference voltage 2b having a voltage value of $V_{r2}$ ($>V_{r1}$). That is, the sampling circuit 22 outputs $V_{r2}-V_{in}$. Then, the sampling circuit 53 samples $V_{r1}-V_{in}$, whereas the sampling circuit 65 samples $V_{r2}-V_{in}$. Meanwhile, the holding capacitors 60 and 63, too, sample $V_{r1}-V_{in}$ and $V_{r2}-V_{in}$, respectively. The voltage amplifier 57 (the degree of voltage amplification: A1) amplifies the output voltage of the sampling circuit 53 to A1 ($V_{r1}-V_{in}$). The voltage amplifier 76 (the degree of voltage amplification: A1), on the other hand, amplifies the output voltage of the sampling circuit 65 to A1 ($V_{r2}-V_{in}$). The voltage amplifier 64 (the degree of voltage amplification: A1) amplifies the intermediate voltage between $V_{r1}-V_{in}$ and $V_{r2}-V_{in}$ so as to produce A1 (($V_{r2}+V_{r1}$)/2$-V_{in}$). In other words, the voltage difference between $V_{in}$ (i.e. the sampled analog voltage) and ($V_{r2}+V_{r1}$)/2 (i.e. the intermediate voltage between the first and second reference voltages) is amplified. The sampling circuits 66, 70, and 74 each sample the output voltages of the voltage amplifiers 57, 64, and 76. Then, such sampled output voltages are amplified by the voltage amplifiers 67, 71, and 75 (the degree of voltage amplification: A2) to produce A1·A2 ($V_1-V_{in}$), A1·A2 {($V_{r2}+V_{r1}$)/2$-V_{in}$}, and A1·A2 ($V_{r2}-V_{in}$), respectively. The sampling circuit 68 samples the output voltage A1 ($V_{r1}-V_{in}$) of the voltage amplifier 57 as well as the output voltage A1 {($V_{r2}+V_{r1}$)/2$-V_{in}$) of the voltage amplifier 64. The intermediate voltage of such two output voltages, or A1·A2 {($V_{r2}+3V_{r1}$)/4$-V_{in}$} is amplified by the voltage amplifier 69 (the degree of voltage amplification: 2). In other words, the voltage difference between $V_{in}$ (i.e. the sampled analog voltage) and ($V_{r2}+3V_{r1}$)/4 (i.e. the intermediate voltage between the first reference voltage and the second reference voltage) is amplified. The sampling circuit 72 operates in the same way that the sampling circuit 68 does, that is, it amplifies the voltage difference between the sampled analog signal and the intermediate voltage between the intermediate voltage between the first and second reference voltages and the second reference voltage, in order to produce A1·A2 {($3V_{r2}+V_{r1}$)/4$-V_{in}$}. The voltage amplifiers 67, 69, 71, 73, and 75 send out output signals which are amplified by the logical-level amplifier 10 to logical-level voltages and which are output by the logic device 11 in the form of the A/D conversion output 12.

The present example reduces the number of voltage amplifiers thereby achieving low-power ADCs, since voltage points as result of equal division between the first and second reference voltages are produced by two holding capacitors that are connected to a voltage amplifier which is one of the components of a sampling circuit.

Example 9

Figure 10:
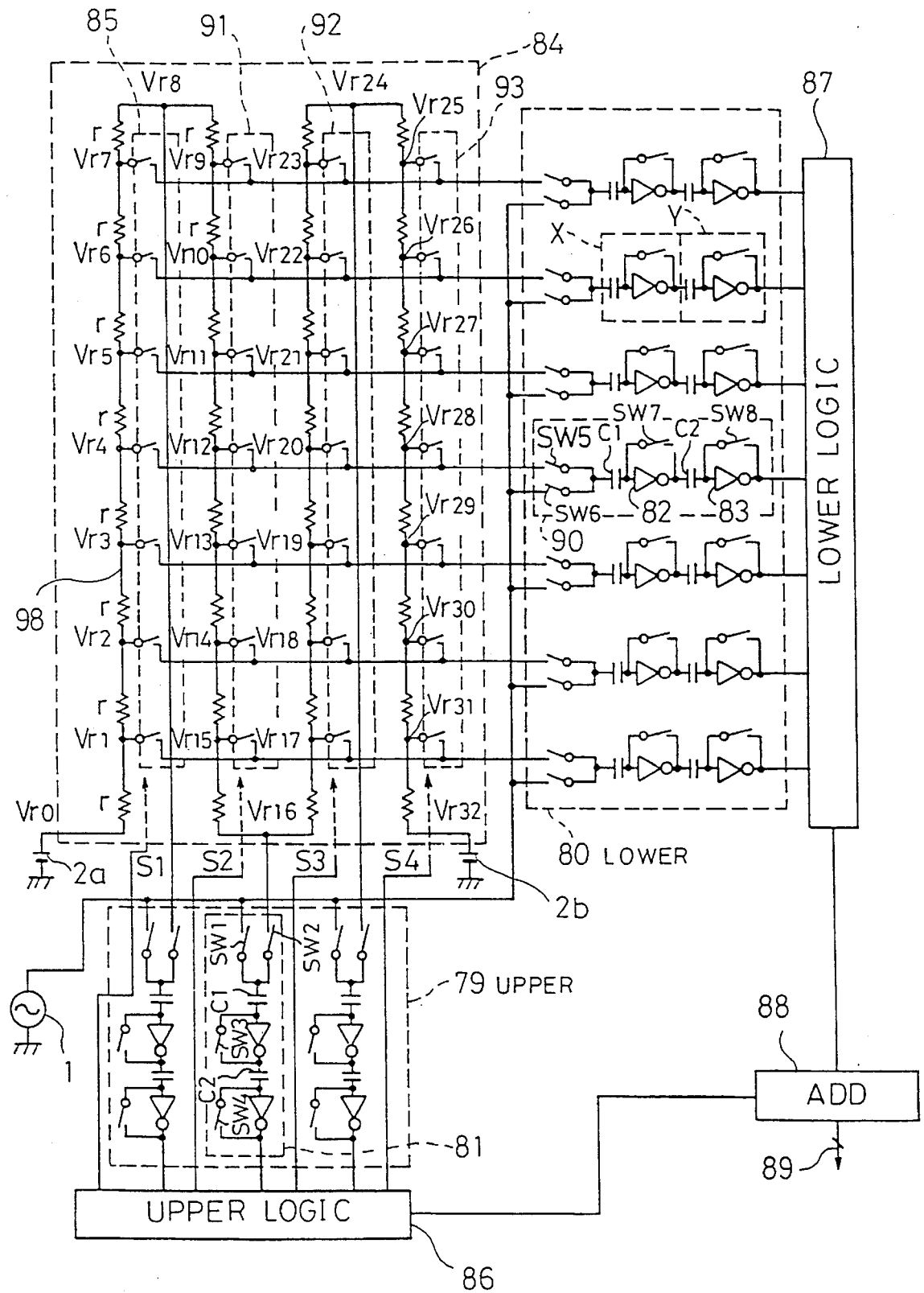
FIG. 10 is a ninth ADC of a 5-bit series-parallel type of the present invention.

Referring now to FIG. 10, the organization of a ninth ADC of a 5-bit series-parallel type is described. A lower comparator row 80 is composed of a group of lower voltage comparators 90. The lower comparator 90 has switches SW5, SW6, SW7, and SW8 which are transfer gates by MOS transistors having a configuration described above. A first terminal of SW6 is connected to an analog signal 1. A second terminal of SW6 is connected to a first terminal of a capacitor C1. A first terminal of SW5 is connected to a reference resistor/switch row 84. A second terminal of SW5 is connected to the first terminal of C1. A second terminal of C1 is connected to an input terminal of an inverter 82 formed by a MOS transistor having a configuration described previously. Also, an inverter 83 is provided which is formed by a MOS transistor having a configuration previously described. SW7 and the inverter 82 are connected together in parallel. A first terminal of a capacitor C2 is connected to an input terminal of the inverter 83. A second terminal of C2 is connected to an output terminal of the inverter 82. SW8 and the inverter 83 are connected together in parallel. C1, SW7, and the inverter 82 together form a first-stage voltage comparator X, while C2, SW8, and the inverter 83 together form a second-stage voltage comparator Y.

An upper comparator row 79 is composed of a group of upper voltage comparators 81. The upper voltage comparator 81 is identical in configuration with the lower voltage comparator 90. A reference resistor row 98 is composed of reference resistors, one end of which is connected to a reference voltage 2a and the other end is connected to a reference voltage 2b. Each upper voltage comparator 81 is provided with a switch SW2. First terminals of switches SW2 are connected to capacitors C1. Second terminals of the switches SW2 are connected respectively to ¼, ¾, and ¾ division points (i.e. terminal voltages $V_{r8}$, $V_{r16}$, and $V_{r24}$) as a result of equal division, by the reference resistor row 98, between the reference voltage 2a (voltage $V_{r0}$) and reference voltage 2b (voltage $V_{r32}$). Each SW1 is connected to the analog signal 1. The upper voltage comparators 81 forming the upper comparator row 79 have output terminals each connected to an upper logic device 86. In the lower comparator row 80, each lower voltage comparator 90 has a switch SW5 that is connected to switch rows 85, 91, 92, and 93. Output terminals of the lower voltage comparators 90 are connected to a lower logic device 87. Each SW6 is connected to the analog signal 1.

The switch row 85 is composed of a group of switches which are respectively connected to $1/32$, $2/32$, $3/32$, $4/32$, $5/32$, $6/32$, and $7/32$ division points (i.e. terminal voltages $V_{r1}$, $V_{r2}$, $V_{r3}$, $V_{r4}$, $V_{r5}$, $V_{r6}$, and $V_{r7}$) as a result of equal division, by the reference capacitor row 98, between the first and second reference voltages 2a and 2b. The switch row 91 is composed of a group of switches which are respectively connected to $9/32$, $10/32$, $11/32$, $12/32$, $13/32$, $14/32$, and $15/32$ division points (i.e. terminal voltages $V_{r10}$, $V_{r11}$, $V_{r12}$, $V_{r13}$, $V_{r14}$, and $V_{r15}$) as a result of equal division between tile first reference voltage 2a and the second reference voltage 2b. The switch row 92 is composed of a group of switches which are respectively connected to $17/32$, $18/32$, $19/32$, $20/32$, $21/32$, $22/32$, and $23/32$ division points (i.e. terminal voltages $V_{r17}$, $V_{r18}$, $V_{r19}$, $V_{r20}$, $V_{r21}$, $V_{r22}$, and $V_{r23}$) as a result of equal division between the first and second reference voltages 2a and 2b. The switch row 93 is composed of a group of switches which are respectively connected to $25/32$, $26/32$, $27/32$, $28/32$, $29/32$, $30/32$, and $31/32$ division points (i.e. terminal voltages $V_{r25}$, $V_{r26}$, $V_{r27}$, $V_{r28}$, $V_{r29}$, $V_{r30}$, and $V_{r31}$) as a result of equal division between the first reference voltage 2a and the second reference voltage 2b. Output terminals of the upper logic device 86 and the lower logic device 87 are connected to an adder 88. The adder 88 outputs an A/D conversion output 89.

Figure 14:
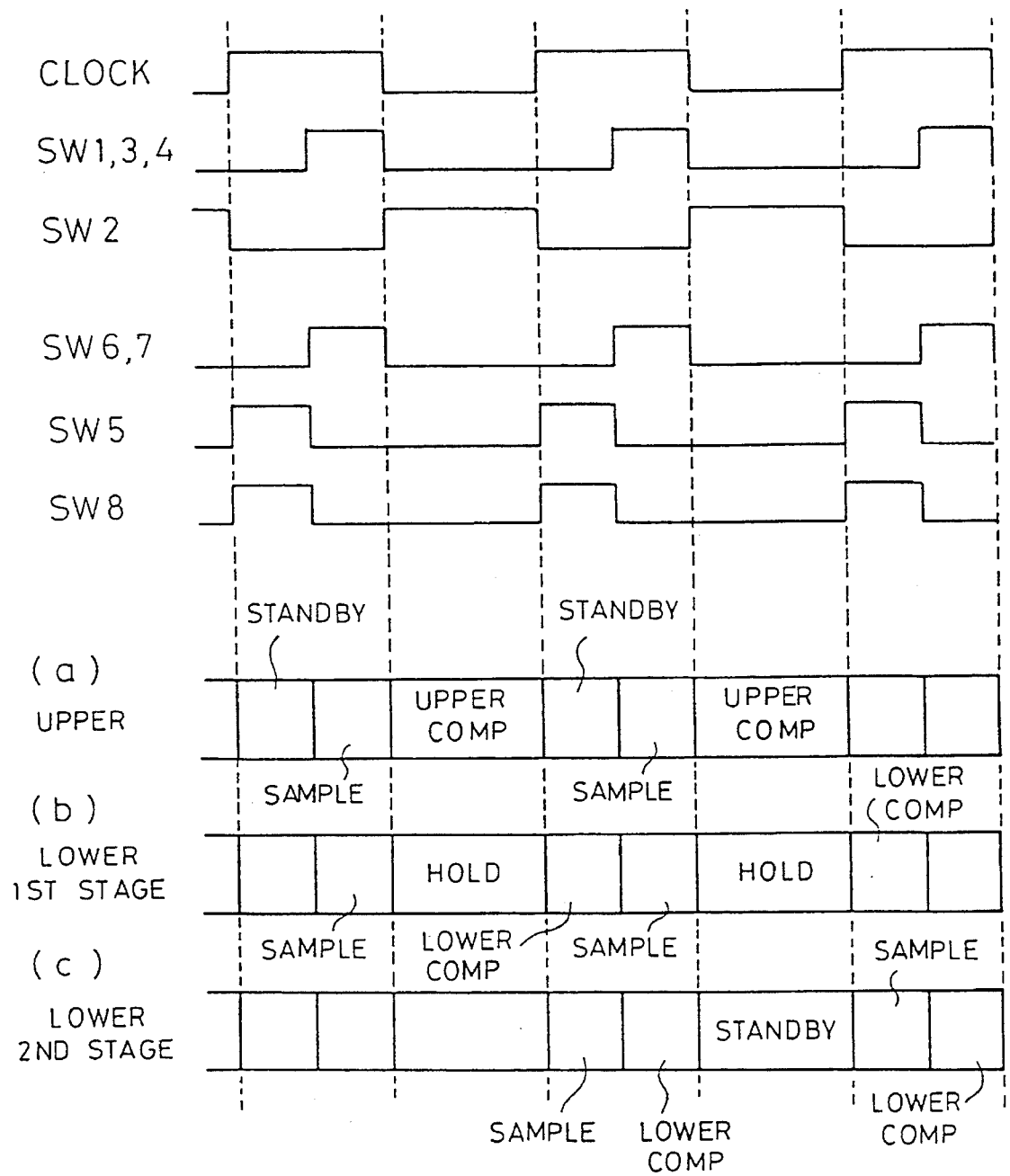
FIG. 14 is a timing diagram of an ADC of FIG. 10.

Next, the operation of the ninth ADC is detailed. FIG. 14 shows the timing of switch operation as to the upper and lower comparator rows 79 and 80. In the upper voltage comparator group, during the stand-by period, SW1, SW2, SW3, and SW4 are in the OFF-state, which indicates that each upper voltage comparator 81 executes none of a sample operation, a hold operation, and a comparing operation during the stand-by period and is Just in preparation for the following sample period. At the next period, that is, at the sample period, SW1, SW3, and SW4 each enter the ON-state for sampling an analog signal voltage according to the operation of the voltage comparator described above. Next, at the upper comparison period, SW2 enters the ON-state, and each upper voltage comparator 81 outputs a comparison result. The above is the operation contents of the upper voltage comparator group, and 1-cycle operation is carried out in one period of a reference clock. The reference clock is an external clock which is applied to the ADC from the outside.

Next, the operation of the lower voltage comparator group is explained. A first-stage voltage comparator group and the upper voltage comparator group enter the sample period at the same time, and SW6 and SW7 each enter the ON-state for sampling an analog signal voltage. At the next period, that is, at the hold period, SW6 and SW7 return to the OFF-state and the analog signal voltage is held. That is, the first-stage voltage comparator group hold the same analog signal voltage as the upper voltage comparator group. Then, at the lower comparison period, SW5 enters the ON-state, and a reference voltage, which is equivalent to the lower voltage comparison range determined from the results of comparison by the upper voltage comparator group, is applied to the first-stage voltage comparator for comparison operation. During the lower comparison period of the first-stage voltage comparator, SW8 enters the ON-state in order that the second-stage voltage comparator is in the sample period. The second-stage voltage comparator samples a comparison voltage from the first-stage voltage comparator. The next lower comparison period is a period corresponding to the sample period of the first-stage voltage comparator, during which SW8 enters the OFF-state, SW7 enters the ON-state, and a voltage sampled by the second-stage voltage comparator is compared with a bias voltage $V_a$ of the first-stage voltage comparator. The operation enters the stand-by period. As described above, in the first- and second-stage voltage comparators, 1-cycle operation is carried out in one period of a reference clock. Since operations start at different time and the operation of pipelining is carried out, this enables a lower comparing result to be output for every one period of a reference clock.

The present example has several advantages over conventional ADCs having two voltage comparator rows. For example, in an ADC in accordance with the present example, it is possible to avoid the drop in comparison precision due to threshold voltage variations between voltage comparator rows. The present example, therefore, will reduce differential non linearity error.

Figure 11:
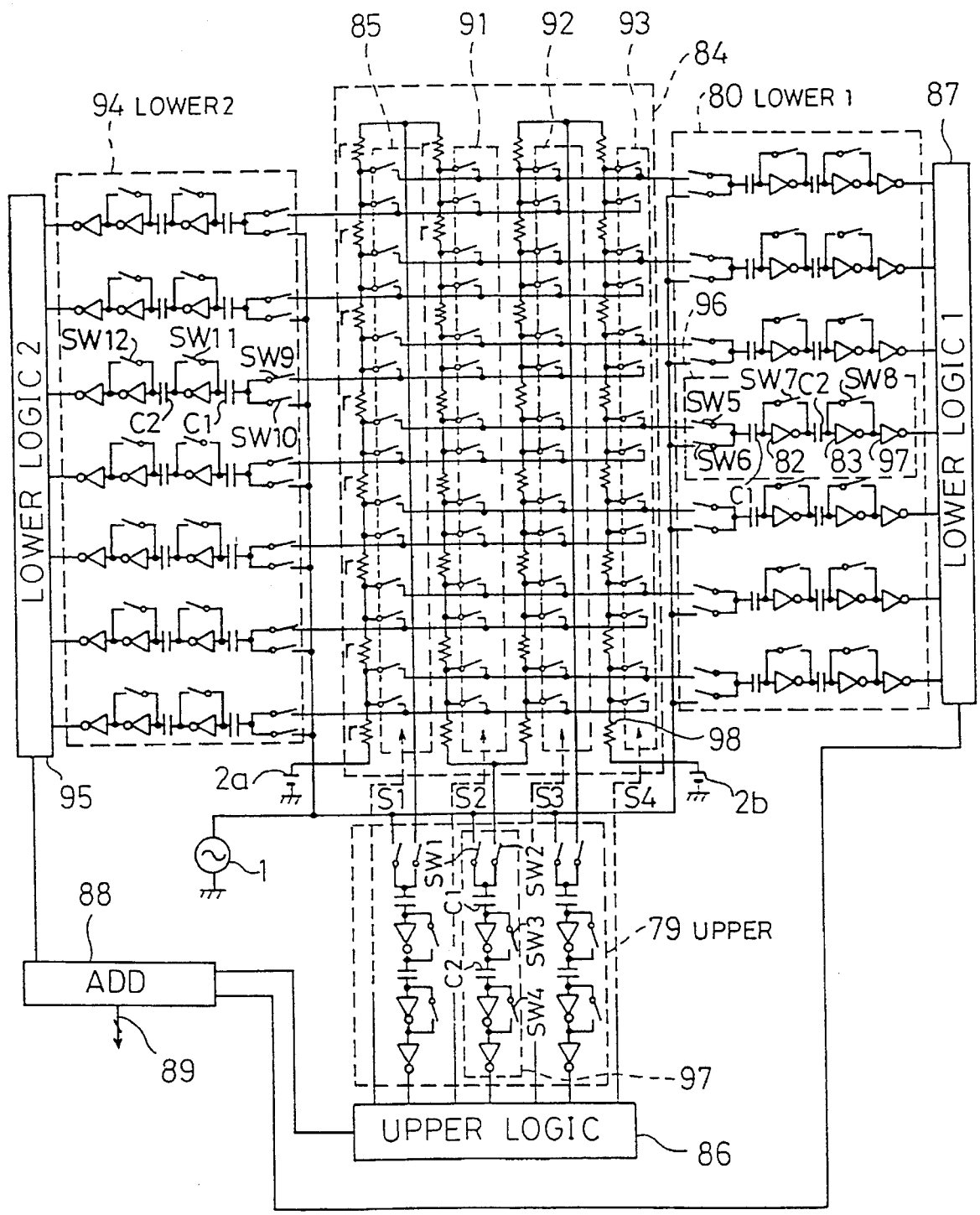
FIG. 11 is a conventional ADC of a 5-bit series-parallel type.
Figure 16:
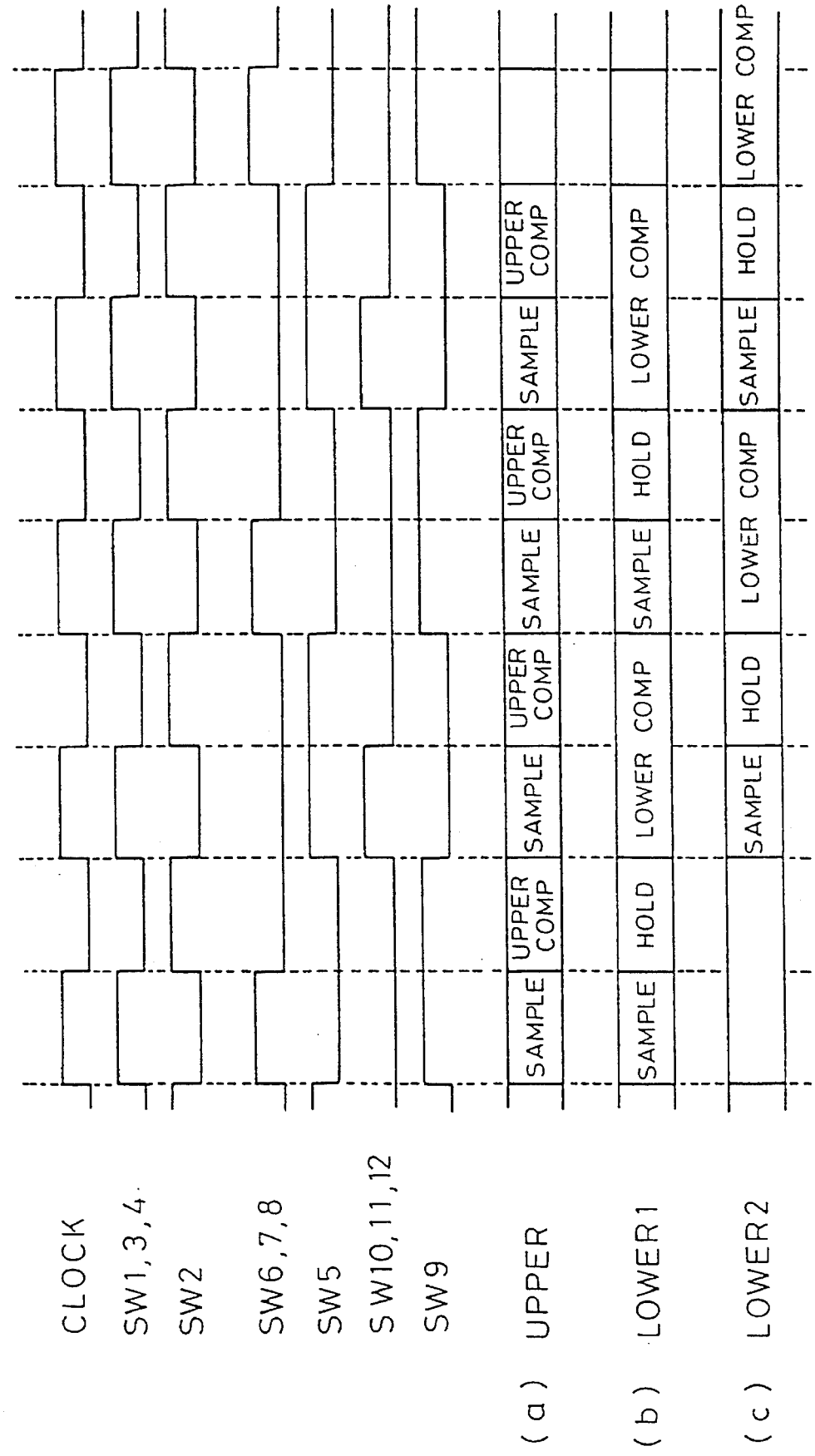
FIG. 16 is a timing diagram of an ADC of FIG. 11.
Figure 24:
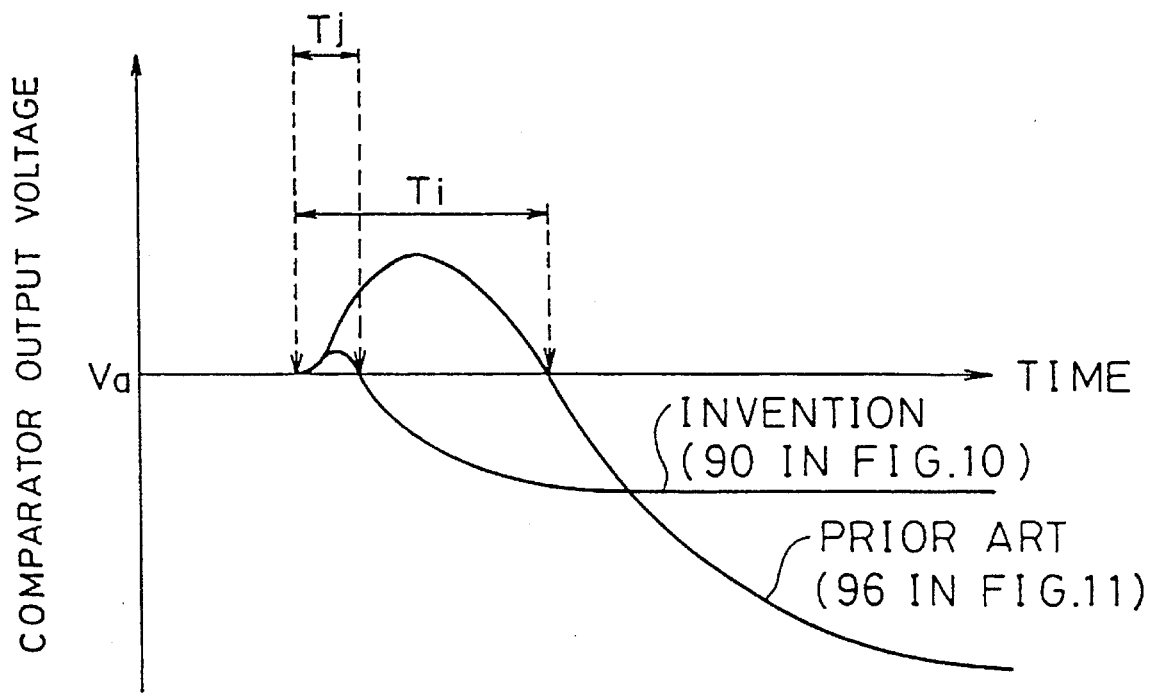
FIG. 24 is a diagram showing the difference in dead band time between the present invention and a prior art technique.

Further, the present example offers the following advantages which are described by reference to FIG. 24. As seen from the figure, $T_i$ is much wider than $T_j$ where $T_i$ is the dead band of the comparison voltage of a lower voltage comparator of a conventional, series-parallel ADC (see FIG. 11) and $T_j$ is the dead band of the comparison voltage of a lower voltage comparator in a series-parallel ADC of the present example. The following is the reason why dead band time occurs. Output voltage varies not only because of pulse current from reference resistors at the time when lower voltage comparators are connected by a switch row to a reference resistor row but because of pulse current generated by implanted or extracted electric charge due to feedthrough of SW5. If the direction of such voltage variations is different from that of the settling voltage of a comparison voltage, this is indicative of the existence of time that is moving in a different direction. Such time becomes dead band time. In conventional techniques, because of the voltage gain of inverters provided at three stages, the variation in voltage, due to pulse current, becomes greater between the lower comparators, and thus a lower voltage comparator has to take a lengthy time to return to $V_a$ (i.e. the comparison voltage threshold). Conversely, in the present example (FIG. 10), at the time when a pulse current is applied, only the first-stage voltage comparator formed by the inverter 82, switch SW7, and capacitor11 C1 exist between the lower comparators. Because of the voltage gain involving only one stage, the variation in voltage due to pulse current is not great and thus $V_a$ is reached in less time compared to conventional ADCs. Thus, $T_j$ becomes shorter than $T_i$ and thus the conversion rate of ADCs is improved. Further, in accordance with the present example, it is possible to provide low-power ADCs. The present example's clock timing (see FIG. 14) is compared with the conventional technique's clock timing (see FIG. 16). As seen from FIG. 16, current flows through all the three inverters in a lower voltage comparator for one period of a reference clock including the sample and hold periods. Conversely, in the present example, as to the first-stage voltage comparator, current flows for ¾ of one period including the sample and the hold periods, and as to the second-stage voltage comparator, it flows for ¼ of one period. Therefore, the total amount of passing-through current can be reduced.

Example 10

Figure 12:
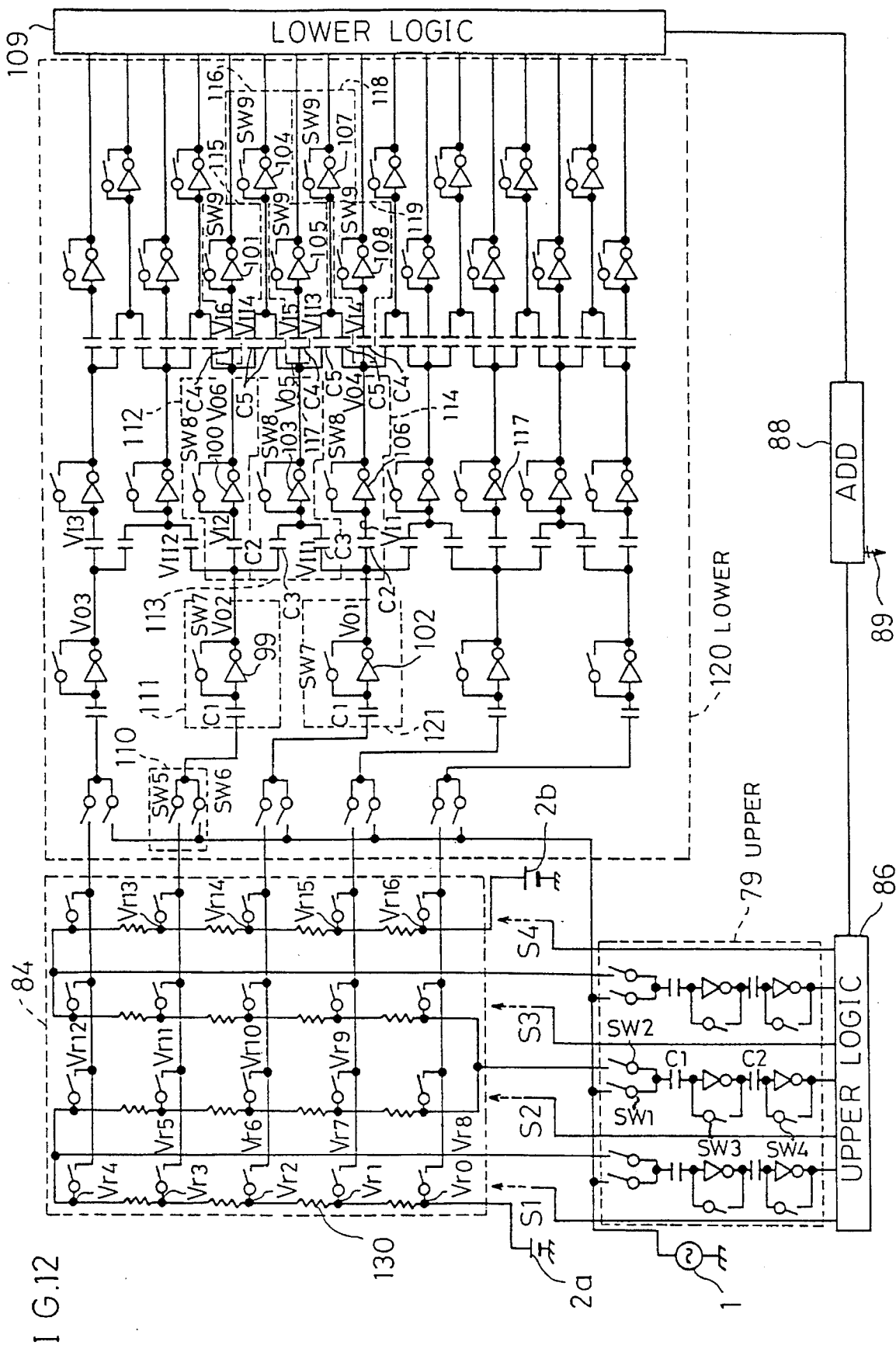
FIG. 12 is a tenth ADC of a 6-bit series-parallel type of the present invention.

Lastly, referring to FIG. 12, the organization of a tenth ADC of a 6-bit, series-parallel type is described. This ADC is similar to the one as shown in FIG. 10 except for a lower voltage comparator row 120 composed of a group of lower voltage comparator. A first terminal of SW5 is connected to a reference resistor row 130 composed of a group of reference resistors. A second terminal of SW5 serves as an output terminal of an input stage 110. A first terminal of SW6 is connected to an analog signal 1. A second terminal of SW6 serves as an output terminal of the input stage 110. The second terminals of SW5 and SW6 are connected together.

A first terminal of C1 serves as an input terminal of a first-stage voltage comparator-ill. A second terminal of C1 is connected to an input terminal of an inverter 99. SW7 and the inverter 99 are connected together in parallel. An output terminal of the inverter 99 serves as an output terminal of the first-stage voltage comparator 111. A first terminal of C2 serves as an input terminal of a second-stage voltage comparator 112. A second terminal of C2 is connected to an input terminal of an inverter 100. The inverter 100 and SW8 are connected together in parallel. An output terminal of the inverter 100 serves as an output terminal of the second-stage voltage comparator 112. A first terminal of first C3 serves as a first input terminal of a second-stage voltage comparator 113. A second terminal of first C3 is connected to an input terminal of an inverter 103. A first terminal of second C3 serves as a second input terminal of the second-stage voltage comparator 113. A second terminal of second C3 is connected to the input terminal of the inverter 103. The inverter 103 and SW8 are connected together in parallel. An output terminal of the inverter 103 serves as an output terminal of the second-stage voltage comparator 113. A second-stage voltage comparator 114 is identical in configuration with the second-stage voltage comparator 112.

A first terminal of C4 serves as an input terminal of a third-stage voltage comparator 115. A second terminal of C4 is connected to an input terminal of an inverter 101. The inverter 101 and SW9 are connected together in parallel. An output terminal of the inverter 101 serves as an output terminal of the third-stage voltage comparator 115. A first terminal of first C5 serves as a first input terminal of a third-stage voltage comparator 116. A second terminal of first C5 is connected to an input terminal of an inverter 104, A first terminal of second C5 serves as a second input terminal of the third-stage voltage comparator 116. A second terminal of second C5 is connected to the input terminal of the inverter 104. SW9 and the inverter 104 is connected together in parallel. An output terminal of the inverter 104 serves as an output terminal of a third-stage voltage comparator 116. Third-stage voltage comparators 117 and 119 are identical in configuration with the third-stage voltage comparator 115. A third-stage voltage comparator 118 is identical in configuration with the third-stage voltage comparator 116.

The output terminal of the input stage 110 is connected to the input terminal of the first-stage voltage comparator 111. The output terminal of the first-stage voltage comparator 111 is connected to the input terminal of the second-stage voltage comparator 112. The output terminal of the second-stage voltage comparator 112 is connected to the input terminal of the third-stage voltage comparator 115. The output terminal of the third-stage voltage comparator 115 is connected to a lower logic device 109. The first input terminal of the second-stage voltage comparator 113 is connected to the output terminal of the first-stage voltage comparator 111. The second input terminal of the second-stage voltage comparator 113 is connected to the output terminal of the first-stage voltage comparator 121. The output terminal of the second-stage voltage comparator 113 is connected to the input terminal of the third-stage voltage comparator 117. The output terminal of the third-stage voltage comparator 117 is connected to the lower logic device 109. The first input terminal of the third-stage voltage comparator 116 is connected to the output terminal of the second-stage voltage comparator 112 and the second input terminal thereof is connected to the output terminal of the second-stage voltage comparator 113. The first input terminal of the third-stage voltage comparator 118 is connected to the output terminal of the second-stage voltage comparator 113 and the second input terminal thereof is connected to the output terminal of the second-stage voltage comparator 114. The lower comparator row 120 is arranged in the above-described way.

Figure 15:
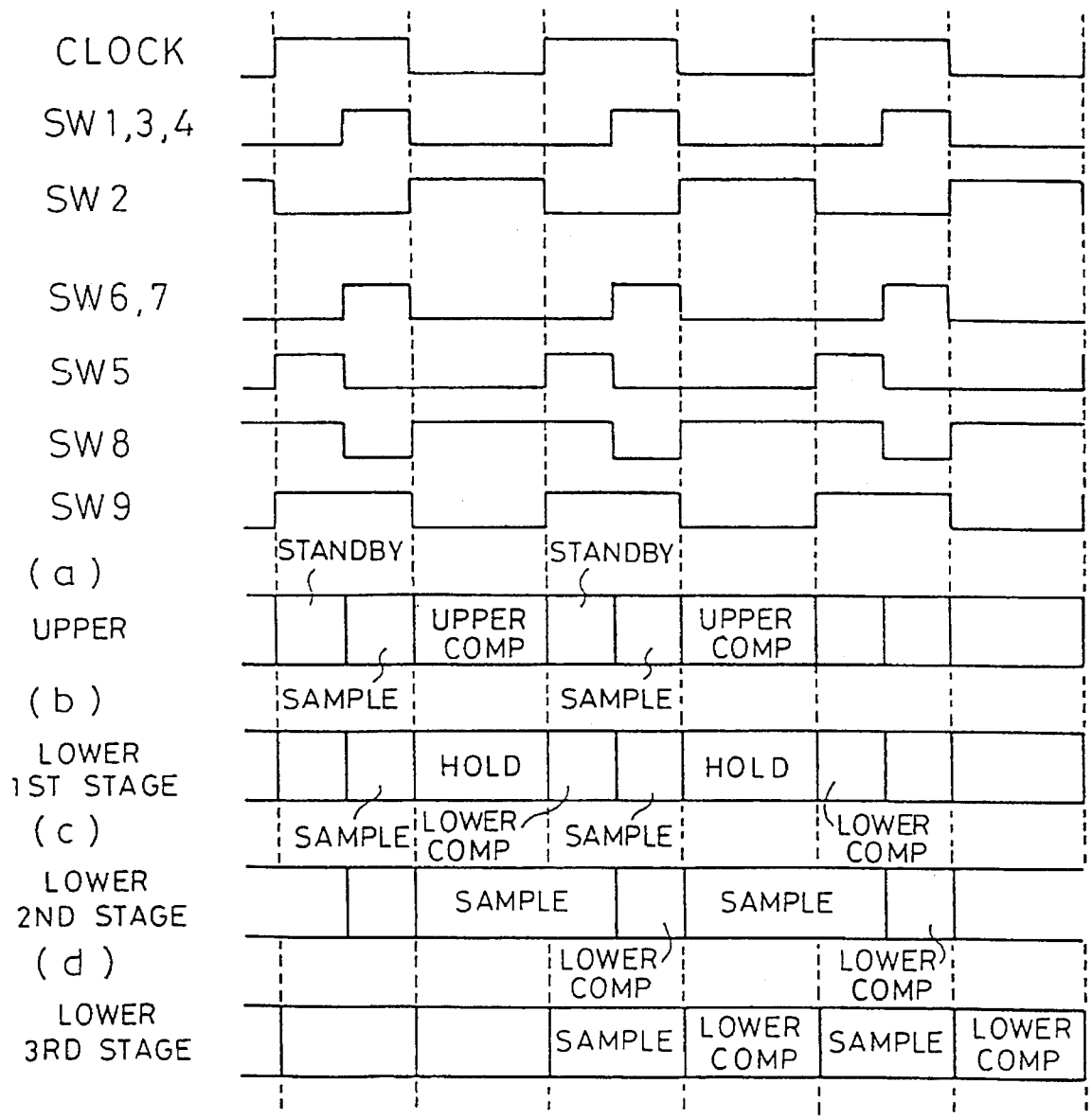
FIG. 15 is a timing diagram of an ADC of FIG. 12.

FIG. 15 shows the timing of switches, according to which the relative operation is detailed. In the upper voltage comparator group, SW1, SW2, SW3, and SW4 are in the OFF-state during the stand-by period. During the sample period, SW1, SW3, and SW4 each enter the ON-state. Then, during the upper comparison period, SW2 comes to have an ON-state. In such a 1-cycle operation, the comparison of an analog signal voltage with a reference voltage is made. The sample period of a first-stage voltage comparator of the lower voltage comparator group is a period equivalent to the sample period of an upper voltage comparator. Next, the hold period follows. Then, an analog signal voltage, which is equivalent to that held at the upper voltage comparator group is held. During the hold period, the upper comparator row outputs upper comparison results so that the range of lower voltage comparison is determined. At the next period, that is, during the first lower comparison period, the first-stage voltage comparator outputs a first comparison voltage as a result of comparison of the analog signal voltage with the reference voltage corresponding to such a determined lower voltage comparison range. When the first-stage voltage comparator is in the first lower comparison period, the second-stage voltage comparator is now in the sample period, and the first comparison voltage is sampled. Next, the timing proceeds to the second lower comparison period which is a period for the second-stage voltage comparator. Since the first-stage voltage comparator now is in the sample period, the second-stage voltage comparator makes a comparison between the first comparison voltage and $V_a$, whereby a second comparison voltage is output. Since, during the second lower comparison period, the third-stage voltage comparator is in the sample period, such a second comparison voltage is sampled by the third-stage voltage comparator. Next, the timing proceeds to the third comparison period that is a period for the third-stage voltage comparator. At this point in time, the second-stage voltage comparator is in the sample period and thus a third comparison voltage as a result of comparing the second comparison voltage with $V_a$ is output. This third comparison voltage is applied to the lower logic device 109.

By making reference to FIGS. 20 to 23, how each of the second-stage voltage comparators 112, 113, and 114 performs the operation of voltage comparison is explained. Here, suppose an analog voltage having a value of $V_{14}$ at T4 (time) is sampled, taking $V_{14}=V_{in1}$ (see FIG. 20). The input terminal voltages of the second-stage voltage comparators 112 to 114 vary as shown in FIG. 21a. The output voltage of the first-stage voltage comparator 111 (i.e. $V_{O2}$) is compared with a reference voltage of $V_{r11}$ if $V_{r10} < V_{in1} < V_{r11}$. $V_{O2}$, therefore, can be written $V_{O2} = Gf(V_{r11} - V_{in1}) + V_a$ (offset voltage) (see the formula (4)) and is represented by line passing through $V_{r11}$ (see FIG. 21a). The output voltage of the first-stage voltage comparator 121 (i.e. $V_{O1}$) is compared with a reference voltage of $V_{r10}$. $V_{O1}$, therefore, can be written $V_{O1} = Gf(V_{r10} - V_{in1}) + V_a$ (offset voltage) and is represented by line passing through $V_{r10}$ (FIG. 21a). If no parasitic capacitance occurs to capacitors C1 to C5, $V_{O1} = V_{I1}$ and $V_{O2} = V_{I2}$. $V_{O1}$ and $V_{O2}$ are voltage-divided by C3 to become $V_{I11}$ ($=\frac{1}{2}(V_{O2} - V_{O1})$). $V_{I11}$ is represented by line passing through point A (i.e. $\frac{1}{2}(V_{r11} - V_{r10})$) (FIG. 21a). In other words, the threshold voltage of the second-stage voltage comparator 113 is $\frac{1}{2}(V_{r11} - V_{r10})$, as a result of which an apparent reference voltage point comes to exist.

A case, where parasitic capacitance occurs to capacitors C1 to C5, is described. If the relationship in capacitance between C2 and C3 is determined in such a way so that the values of parasitic capacitance being applied to input terminals of inverters of tile second-stage voltage comparators are identical with one another (for example, C2/C3= 2), electric charge redistribution by C2, C3, and parasitic capacitance takes place at the same time. Accordingly, the inverters have apparently the same voltage gain and the foregoing threshold voltage appears at a point of $\frac{1}{2}(V_{r11} - V_{r10})$. The same is applied to $V_{I12}$ (i.e. $V_{I12} = \frac{1}{2}(V_{O3} - V_{O2})$) and an apparent reference voltage point appears at point B that is a voltage level of $\frac{1}{2}(V_{r12} - V_{r11})$. Since input terminal voltages $V_{I3}$, $V_{I4}$, and $V_{I5}$ of the third-stage voltage comparators 115, 117, and 119 vary for the same reason that the foregoing $V_{I1}$ and $V_{I2}$ do, their apparent reference voltage points appear at points of $\frac{1}{4}(V_{r10} - V_{r11})$, $\frac{1}{2}(V_{r10} - V_{r11})$, and $\frac{3}{4}(V_{r10} - V_{r11})$ (see FIG. 21b). From the above-described voltage change, it is understood that reference voltage points C, A. D appear at quarterly divided locations between $V_{r10}$ and $V_{r11}$. If, in FIG. 23, it is judged that an analog signal voltage exists between point E and point F, the high-order bit digital output is [10] (binary numeral) and the low-order bit digital output is [0010]. Such results is output by the adder 88 in the form of [100010].

Figure 22:
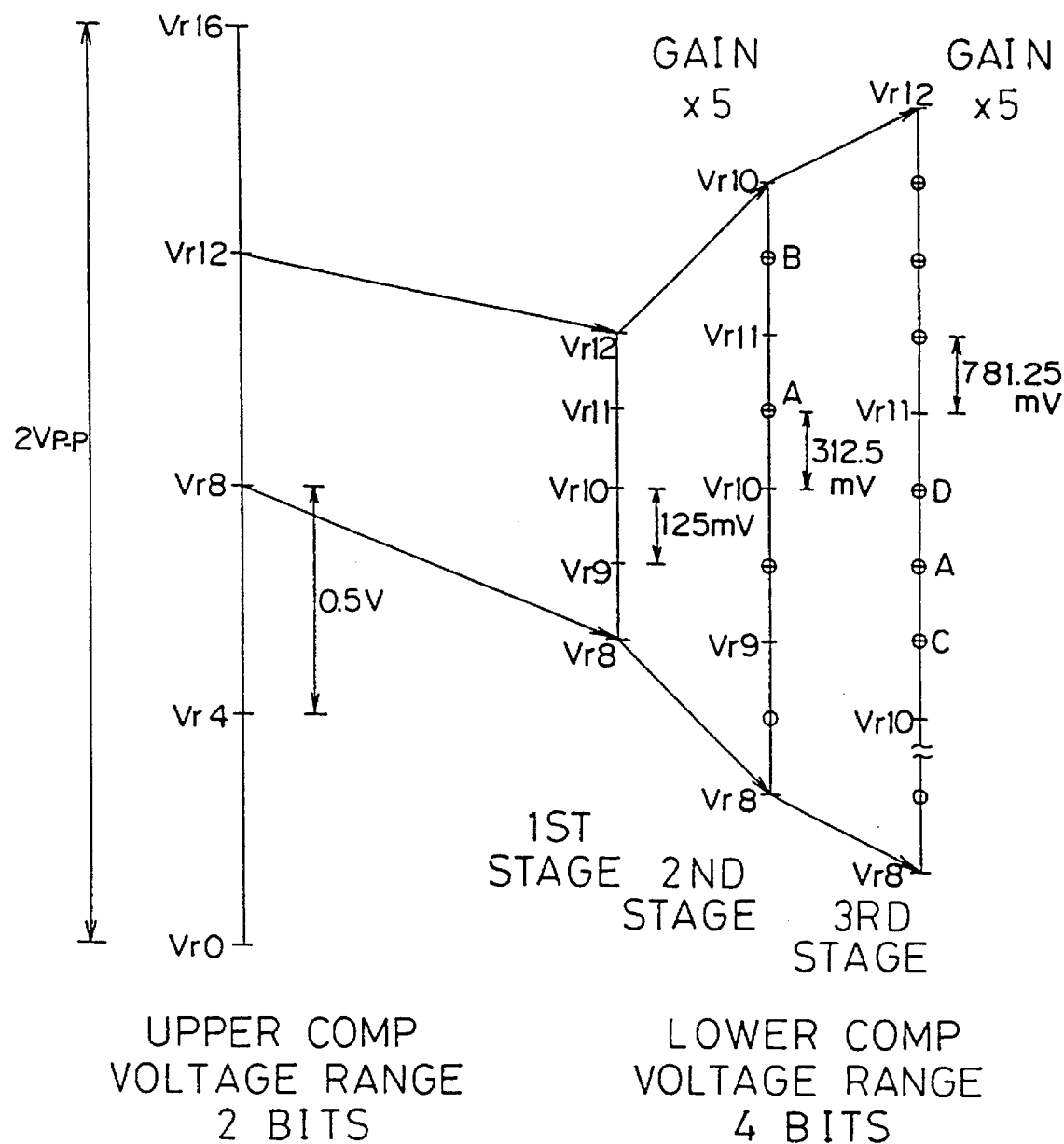
FIG. 22 is a diagram showing the upper and lower voltage comparison ranges of a series-parallel ADC.
Figure 23:
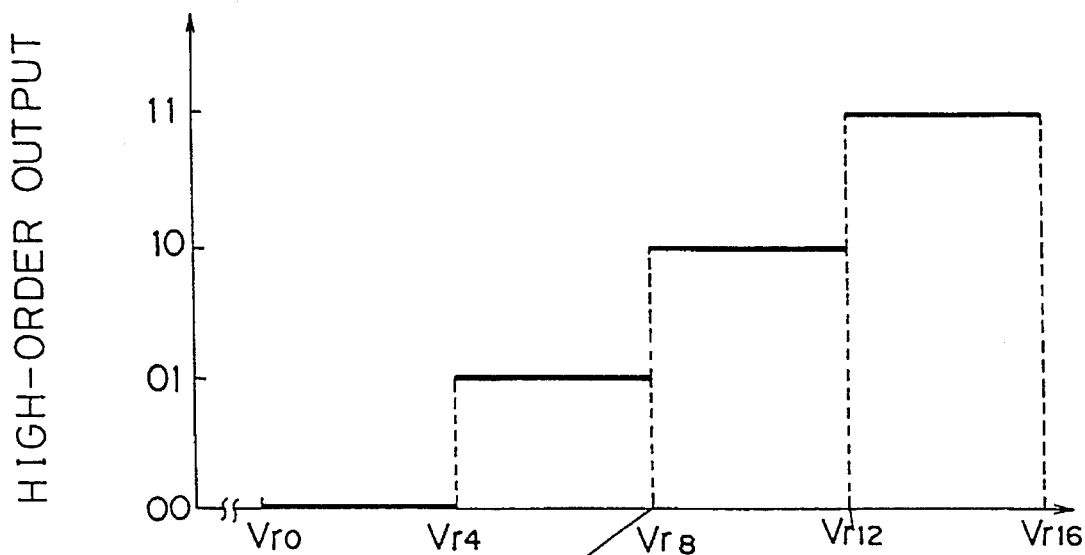
FIG. 23a is a diagram showing the upper bit digital data output of an ADC.
FIG. 23b is a diagram showing the lower bit digital data output of an ADC.
Figure 23:
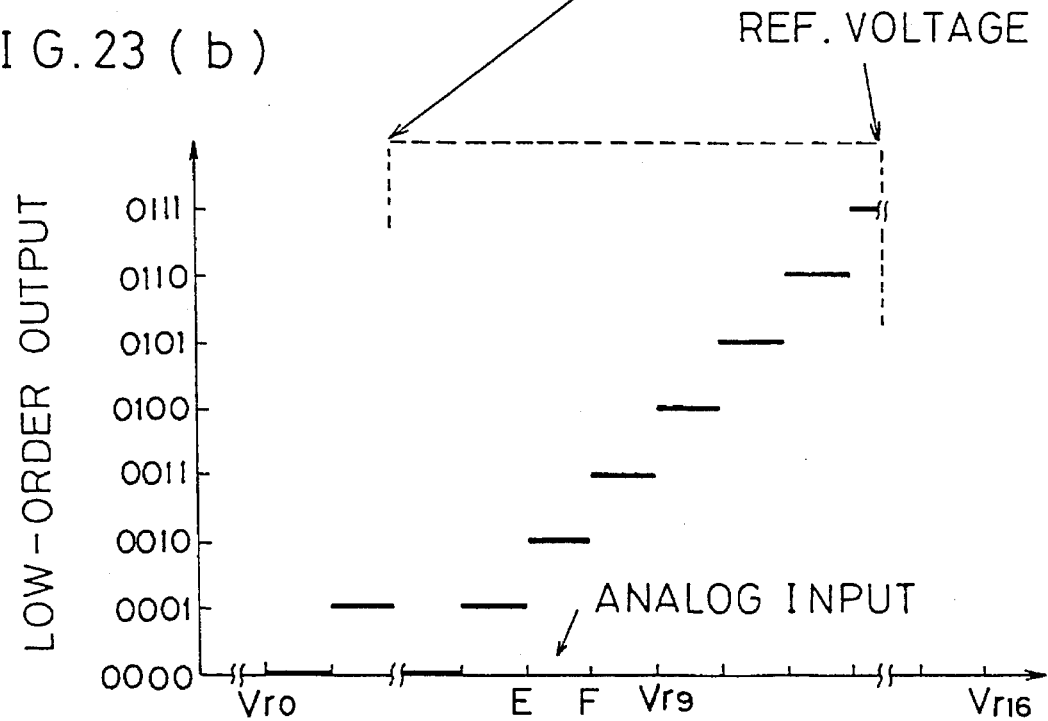

In this way, the lower comparator row 120, by the use of the reference voltages applied between the neighboring first-stage voltage comparators and by the use of the quarterly-divided, apparent reference voltage points, performs 4-bit conversion, which is shown in FIG. 22. In FIG. 22, the inverter upper comparison voltage range, and the lower comparison voltage range which is selected by the comparison result produced by the upper voltage comparator group are shown. Because of the operation of inverter voltage gain, the following can be proved. Since the range of comparison voltage used for a voltage comparator at one stage becomes increased at the next stage because of inverter voltage gain, this alleviates the comparison precision of a subsequent-stage voltage comparator. Differential non linearity error is reduced, accordingly. This also improves ADC resolution. Further, by dividing comparison voltage by the use of capacitors, apparent reference voltage is produced and thus the size of voltage comparators is reduced. The number of inverters becomes decreased. The total amount of electric current flowing through inverters during both the sample period and the hold period can be reduced. Low-power ADCs are achievable. Because of creating these apparent reference voltage points, threshold variations due to device parameters can be alleviated.

If voltage comparators having a configuration of the present invention are connected to the output terminals of the third-stage voltage comparators of the lower comparator row 130 in cascade connection, this improves ADC resolution. The inverter voltage gain linear zone is limited. This necessitates that the voltage gain of a particular inverter at one stage should be adjusted in order that the voltage gain linear zone of an inverter at the next stage covers the output voltage of that particular inverter. By the use of such adjustable voltage amplifiers, ADC resolution can be improved to a further extent. Voltage comparators of such a type are shown in FIG. 18a, 18b, and 18c. By applying them to a 6-bit series-parallel ADC of the tenth example, it is possible to improve ADC resolution.

In FIG. 18a, in addition to the input stage 110 and first-stage voltage comparator 111, a capacitor Cs is added to the lower comparator row 120. Voltage gain can be adjusted by means of electric charge redistribution by C1 and Cs.

In FIG. 18b, in addition to the input stage 110 and first-stage voltage comparator 111, an inversion amplifier 129 is added to the lower comparator row 120. The timing of switches is the same as shown in FIG. 15. An inverter 128 applies a voltage of $V_a$ to an input terminal of the inversion amplifier 129. The inversion amplifier 129 is able to set the voltage gain at, for example, −1 by the ratio of PMOS mutual conductance to NMOS mutual conductance.

In FIG. 18c, capacitor C1 has two terminals one of which serves as an input terminal and the other of which is connected to an input terminal of a non-inversion amplifier circuit 125 which is a source follower circuit. SW3 and the inverter 128 is connected together in parallel. An input terminal of the inverter 128 is connected to the input terminal of the non-inversion amplifier 125. The input and output terminals of the inverter 128 are short-circuited when SW3 is turned on thereby biasing the non-inversion amplifier 125 at $V_a$, and the inverter 128 is voltage-followed by the non-inversion amplifier 125 whose input-to-output voltage ratio is 1:1. In other words, the inverter 128 becomes a voltage comparator whose input-to-output voltage ratio is 1:1. The timing of switches is the same as shown in FIG. 15.

The ADC of FIG. 12 is explained by reference to the timing diagram of FIG. 15. It is possible for the lower comparator row 120 to operate according to the switch timing of FIG. 14 by making SW9 operate in the same way that SW8 does. The same effects are achievable. In the example of FIG. 12, the second- and third-stage voltage comparators are ones that use voltages resulting from dividing comparison voltages of the neighboring voltage comparators provided at a preceding stage. However, a voltage comparator of such a type may be applied to either at the second-stage or the third-stage. The aforesaid effects can be obtained.

Figure 17:
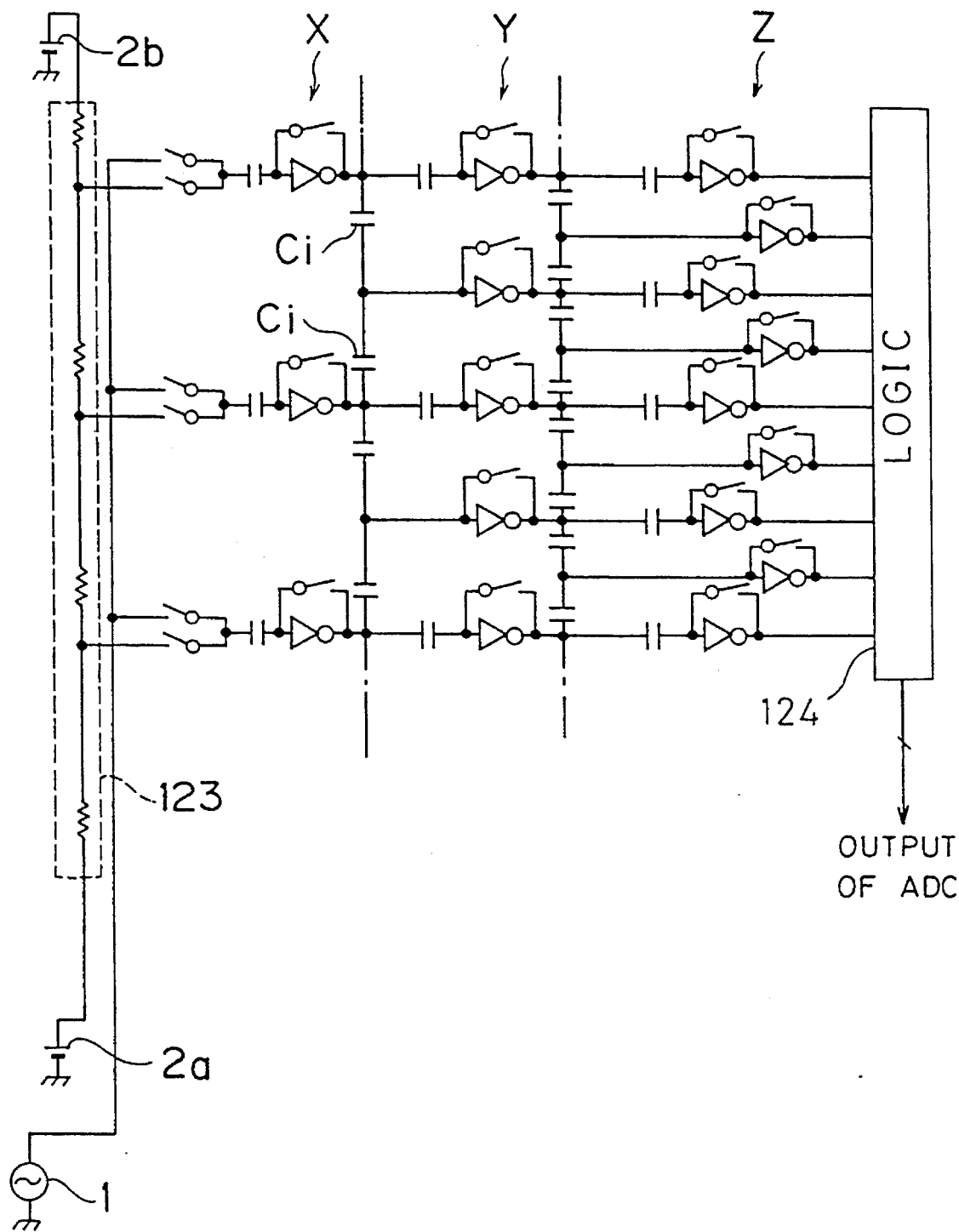
FIG. 17 is another ADC of a 4-bit series-parallel type of the present invention.
Figure 19:
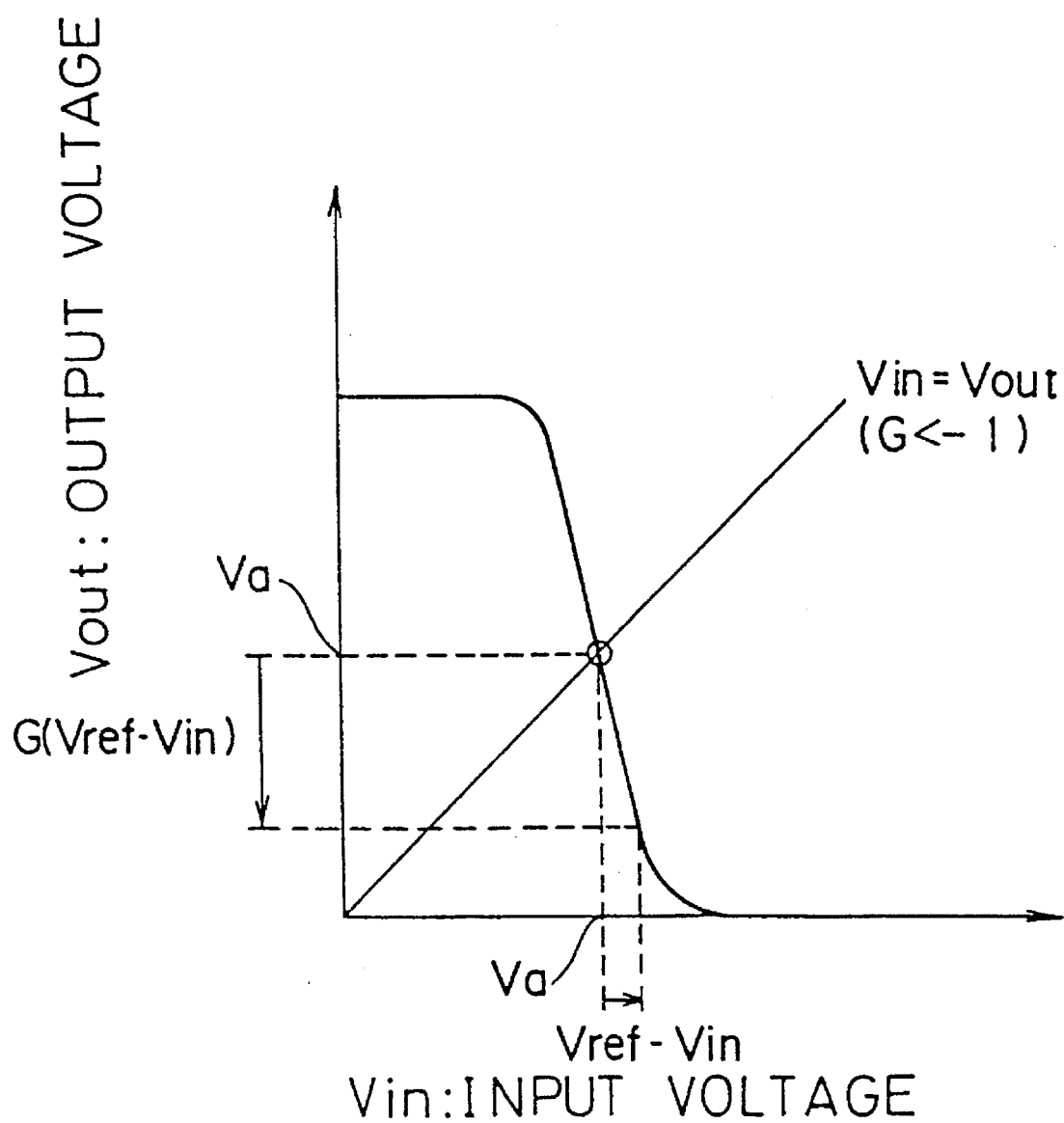
FIG. 19 is a graph showing an inverter input/output static characteristic curve.
Figure 20:
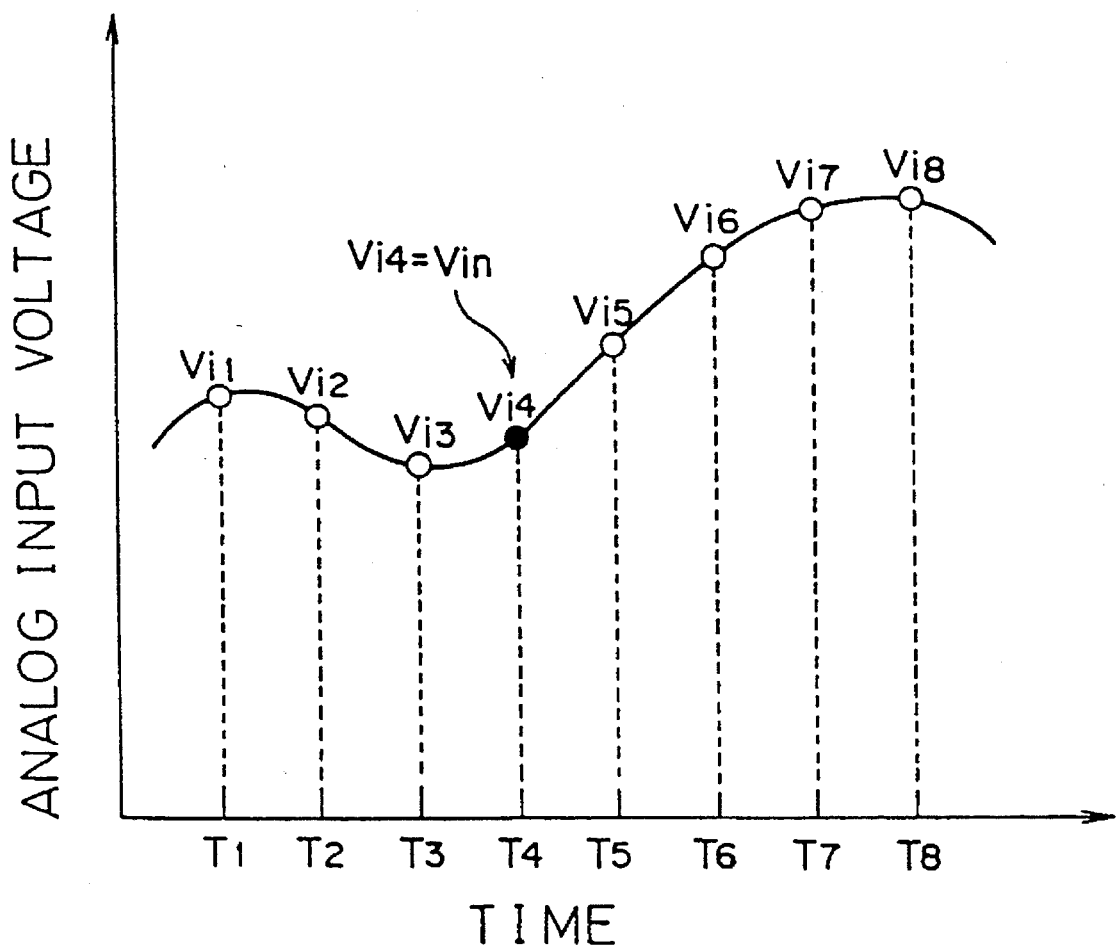
FIG. 20 is a graph showing an ADC sample operation.
Figure 21A:
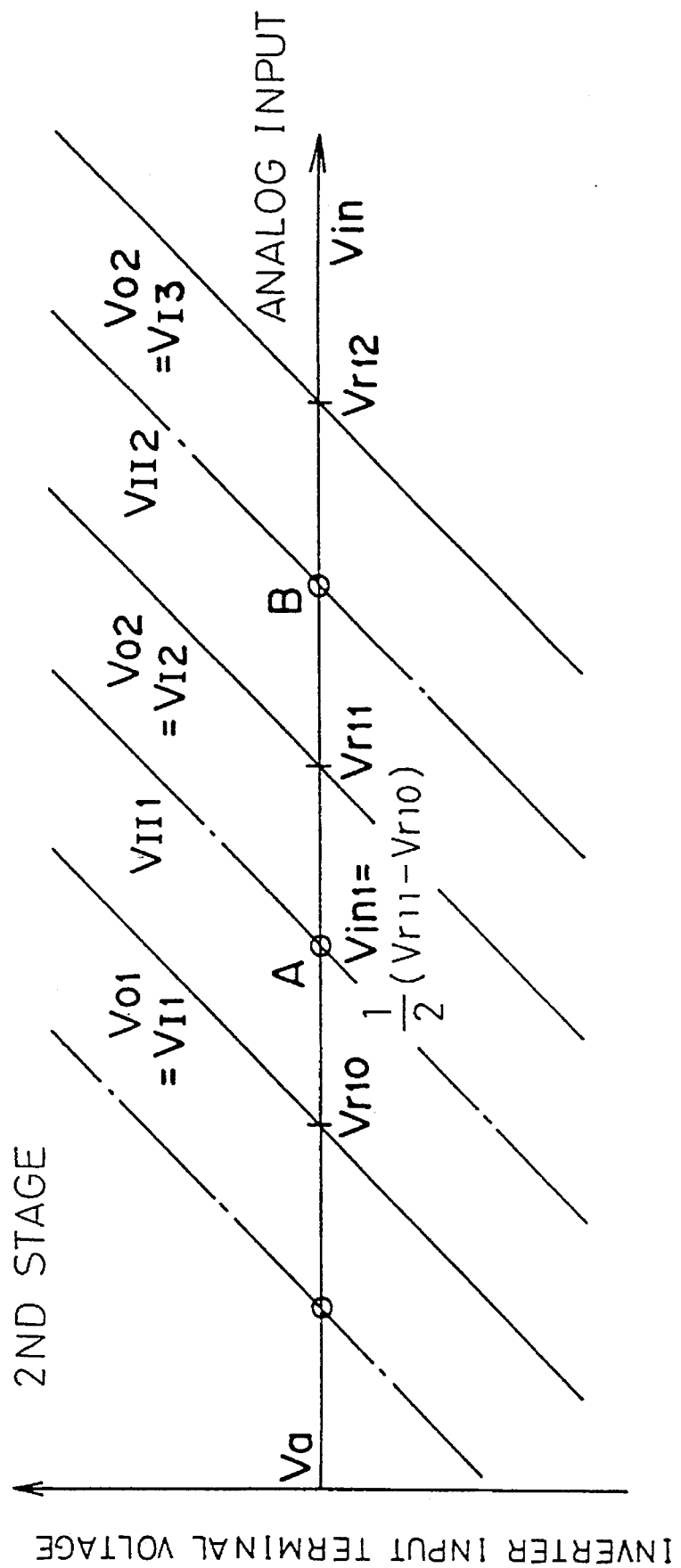
FIG. 21a is a diagram showing an inverter input terminal voltage curve of a second-stage voltage amplifier.
Figure 21B:
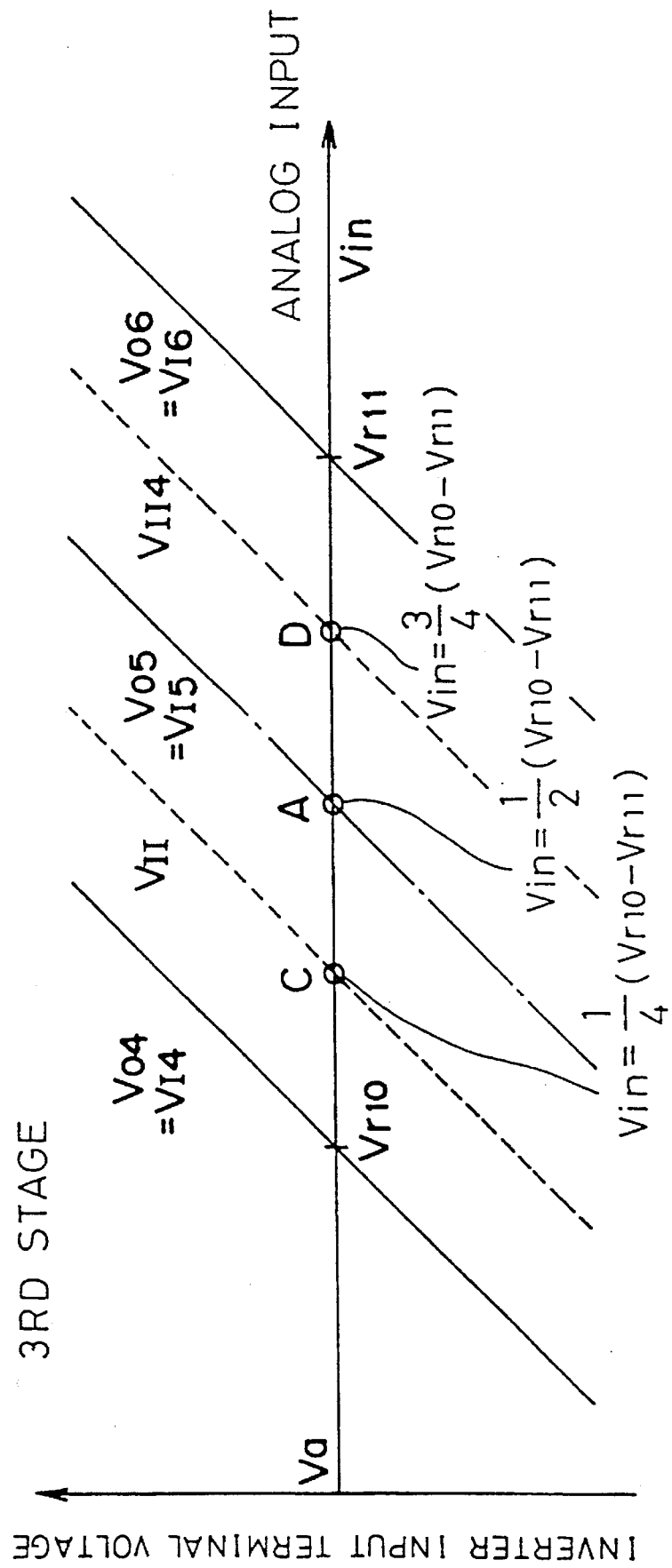
FIG. 21b is a diagram showing an inverter input terminal voltage curve of a third-stage voltage amplifier.

The voltage comparator rows X, Y, and Z in accordance with the present invention may be applied to, for example, a 4-bit parallel ADC (see FIG. 17). The same effects, of course, can be obtained. FIG. 17 shows reference voltages 2a and 2b, a reference resistor row 123, a logic device 124, and an interpolation capacitor Ci.

Figure 13:
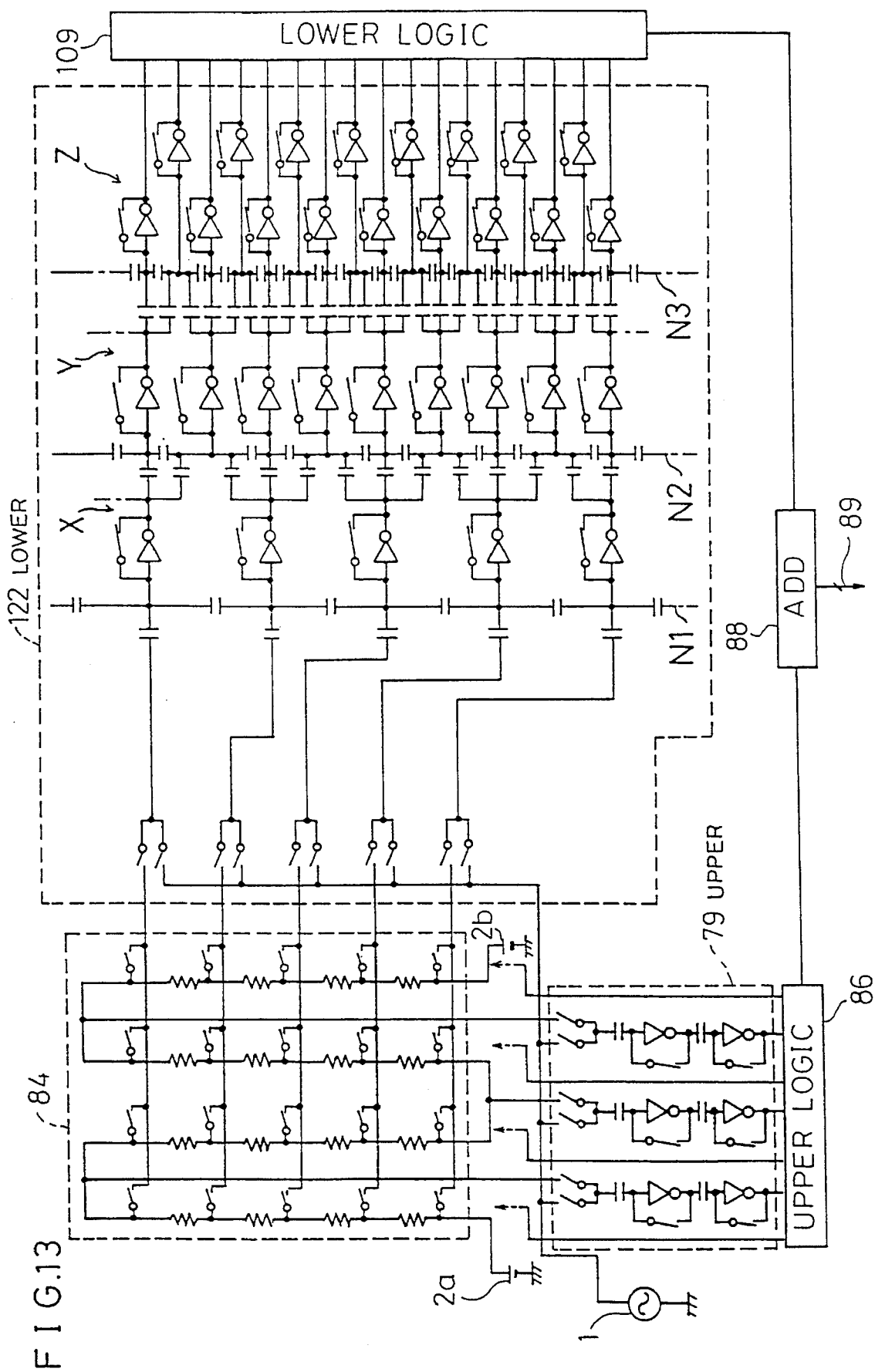
FIG. 13 is a modification of an ADC of FIG. 12 with a capacitor network.

FIG. 13 is a modification of a 6-bit series-parallel ADC of FIG. 12 with a capacitor network. In order to connect capacitors between terminals that are designed in such a way that the voltage difference between neighboring voltage points are equalized, capacitors are inserted between input terminals of neighboring inverters which are elements of a first-stage voltage comparator group X. Further, capacitors are inserted between input terminals of neighboring inverters which are elements of a second-stage voltage comparator group Y. Furthermore, capacitors are inserted between input terminals of neighboring inverters which are elements of a third-stage voltage comparator group Z. The first-, second-, and third-stage voltage comparator groups X, Y, and Z may be redundant voltage comparators so as to alleviate effects due to voltage errors occurring at the end. Use of capacitor networks N1, N2, and N3 presents several advantages. For example, the degradation of differential non linearity, caused by the variation in the amount of electric charge implanted or extracted by feedthrough from switches, is alleviated, particularly at the first-stage voltage comparator group X. At the second- and third-stage voltage comparator groups Y and Z, the variation in electric charge implanted by feedthrough is alleviated and the variation in voltage gain is alleviated at the first- and second-stage inverters. Because of this, differential non linearity error is reduced. It is possible to omit the provision of any one of N1, N2, and N3. For example, the capacitor network N2, which, in the example, is connected to tile second-stage voltage comparator Y, can be omitted.

Figure 25:
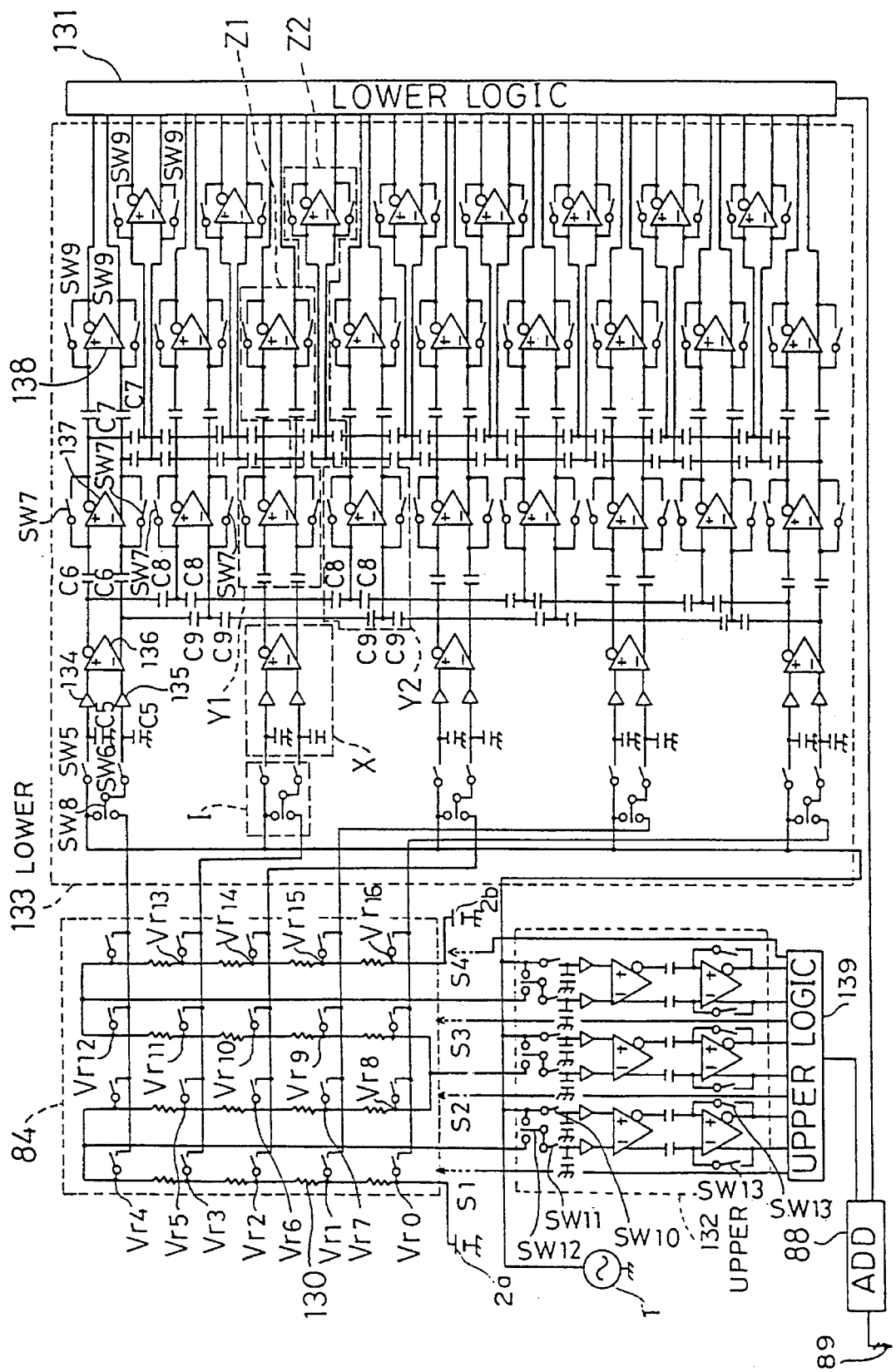
FIG. 25 is a 6-bit, series-parallel ADC, which is a modification of a tenth ADC of FIG. 10 with differential voltage comparators.

A series-parallel ADC of FIG. 12 employs a voltage comparator with one input terminal and one output terminal formed by inverters, switches and capacitors. A differential voltage comparator may be used. FIG. 25 shows a 6-bit series-parallel ADC formed by differential voltage comparators. An upper comparator row 132 is composed of a group of voltage comparators each formed by capacitors, switches, and differential amplifiers.

Figure 26:
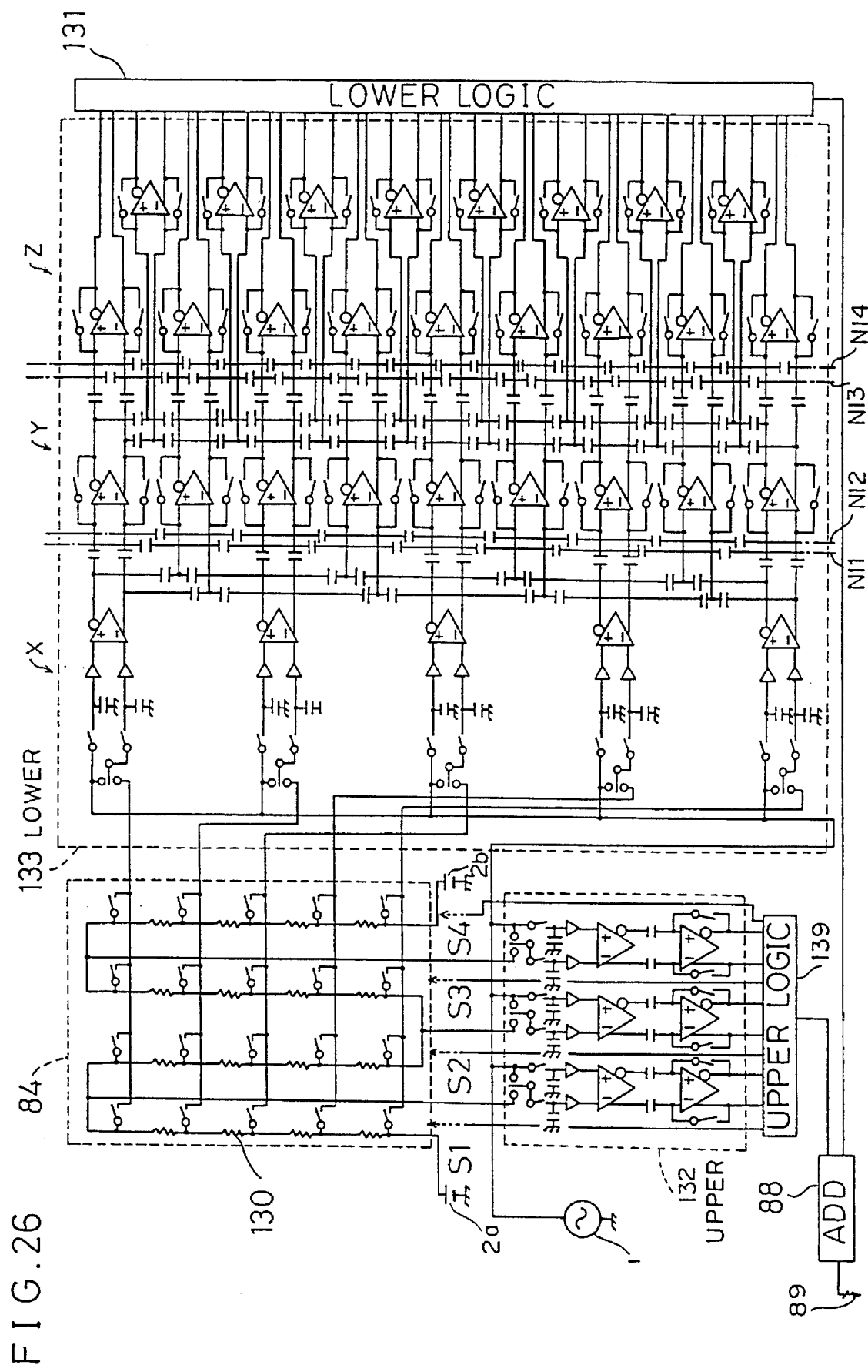
FIG. 26 is a modification of an ADC of FIG. 25 with a capacitor network.
Figure 27:
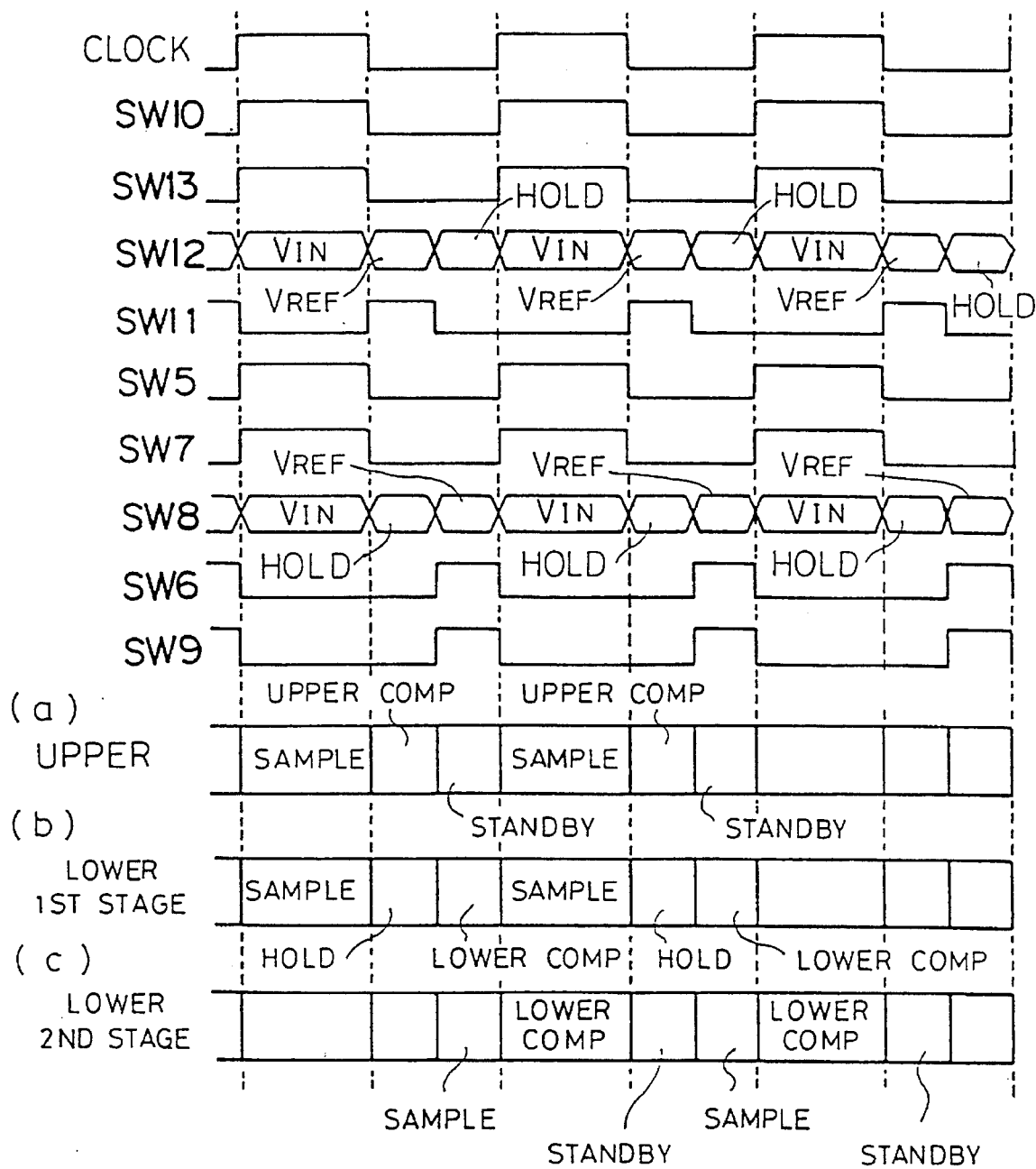
FIG. 27 is a timing diagram of an ADC of FIG. 25.
Figure 28:
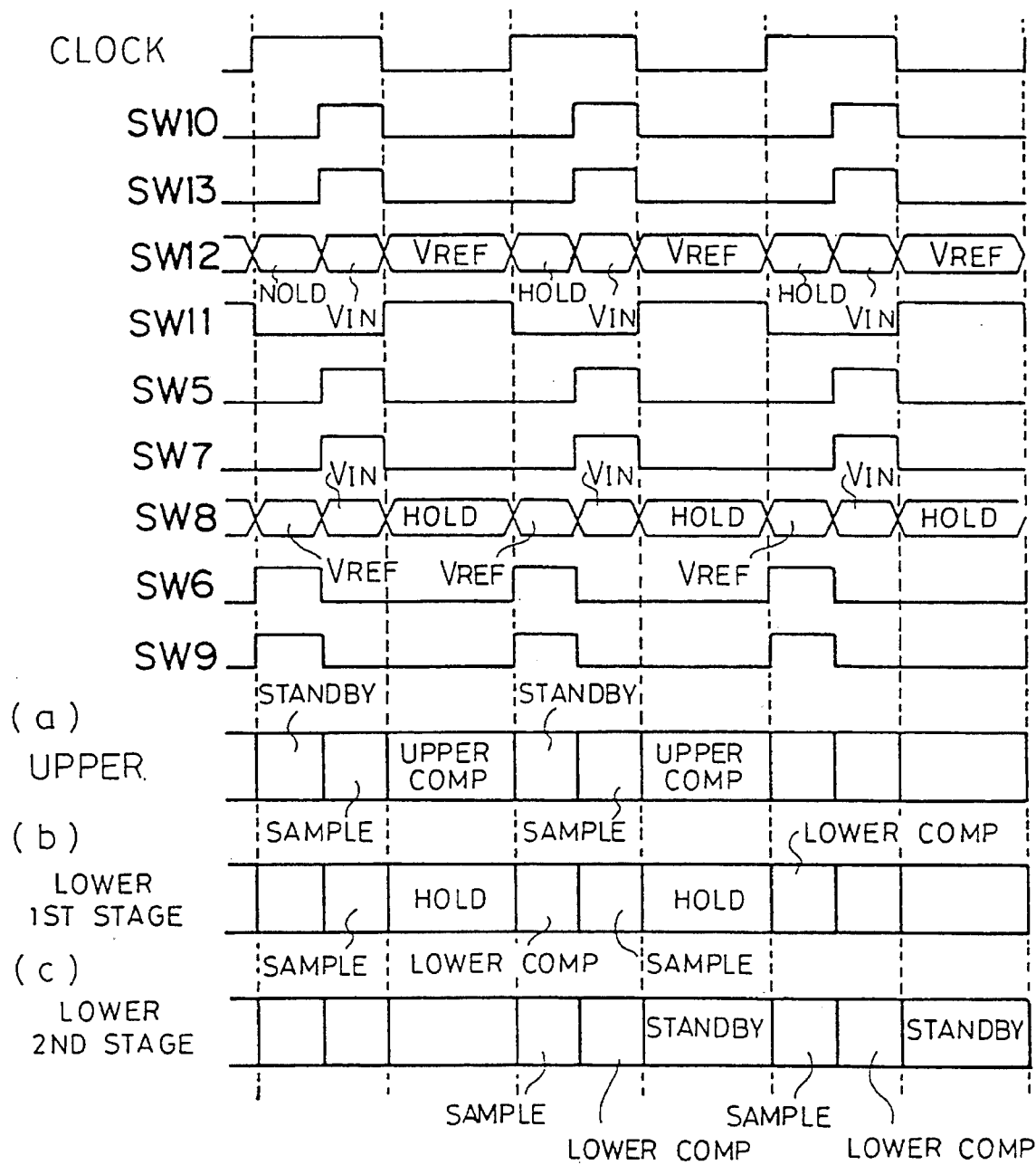
FIG. 28 is another timing diagram of an ADC of FIG. 25.

In FIG. 25, an input stage I has a switch having the function of switching between an analog signal voltage and a reference voltage. In a first-stage voltage comparator X, a non-inverting input terminal of a differential amplifier 136 is connected to a source follower 134, and an inverting input terminal of the differential amplifier 136 is connected to a source follower 135. An input terminal of the source follower 134 is connected to a first capacitor C5. An input terminal of the source follower 135 is connected to a second capacitor C5. Second-stage voltage comparators Y1 and Y2 are composed of (a) a circuit in which a switch is inserted between a non-inverting input terminal and an inverting output terminal of a differential amplifier, another switch is inserted between an inverting input terminal and a non-inversion output terminal, and the comparison voltage of the first-stage voltage comparator is sampled, and (b) a circuit in which the comparison voltage of the adjacent first-stage voltage comparator is divided by a capacitor for sampling. Third-stage voltage comparators Z1 and Z2 are identical in configuration with the second-stage voltage comparators Y1 and Y2 and are composed of a circuit for sampling the comparison voltage of the second-stage voltage comparator and a circuit for dividing the comparison voltage of the adjacent second-stage voltage comparator for sampling. The timing of switches is shown in FIGS. 27 and 28. By transferring analog voltage, the lower voltage comparators are arranged into a single lower comparator row. Further, the use of interpolation capacitors alleviates required ADC comparison precision. Differential non linearity error is reduced and thus ADC resolution is improved. Less power is required. FIG. 26 is a modified ADC with a capacitor network. With this configuration, the variation in differential amplifier voltage gain as well as the feedthrough of switches is alleviated. Therefore, differential non linearity can be improved.

The invention claimed is:

1. An analog-to-digital converter (ADC) comprising:

plural sets of first sampling means for sampling an analog input voltage, each set of said first sampling means including a first switch, a first holding capacitor, and an amplifying means for amplifying the voltage difference between a sampled analog input voltage and a reference voltage;

plural sets of second sampling means for sampling the amplified voltage difference between a sampled analog input voltage and a reference voltage and providing an output voltage for each set of second sampling means, each set of said second sampling means including a second switch, a second holding capacitor;

logical-level amplifier means for amplifying each said output voltage to a logical-level voltage; and a logic device for converting said logical-level voltage into a digital value;

wherein the output voltages serve as comparison signals for execution of the analog-to-digital conversion.

2. An ADC comprising;

first sampling means for sampling an analog input voltage;

amplifying means for amplifying the voltage difference between a sampled analog input voltage and a reference voltage;

second sampling means for sampling an output voltage of said amplifying means and providing an output voltage;

logical-level amplifier means for amplifying the output voltage of said second sampling means to a logical-level voltage; and a logic device for converting said logical-level voltage into a digital value;

wherein said output voltage of said second sampling means serves as a comparison signal for execution of the analog-to-digital conversion.

3. An ADC comprising;

first sampling means for sampling an analog input voltage to output the voltage difference between a sampled analog input voltage and a reference voltage;

subtracting means for subtracting an offset voltage of said first sampling means;

second sampling means for sampling an output voltage of said amplifying means and providing an output voltage;

logical-level amplifier means for amplifying the output voltage of said second sampling means to a logical-level voltage; and a logic device for converting said logical-level voltage into a digital value;

wherein said output voltage of said second sampling means serves as a comparison signal for execution of the analog-to-digital conversion.

4. An ADC comprising;

first sampling means for sampling an analog input voltage;

amplifying means for amplifying the voltage difference between a sampled analog input voltage and a reference voltage;

subtracting means for subtracting an offset voltage of said first sampling means;

second sampling means for sampling an output voltage of said amplifying means and providing an output voltage;

logical-level amplifier means for amplifying the output voltage of said second sampling means to a logical-level voltage; and a logic device for converting said logical-level voltage into a digital value;

wherein said output voltage of said second sampling means serves as a comparison signal for execution of the analog-to-digital conversion.

5. An ADC comprising;

first sampling means for sampling an analog input voltage by the use of a holding capacitor and by the use of an amplifier whose input and output terminals are short circuited for producing a bias voltage;

amplifying means for amplifying the voltage difference between a sampled analog input voltage and a reference voltage;

second sampling means for sampling an output voltage of said amplifying means and providing an output voltage;

logical-level amplifier means for amplifying the output voltage of said second sampling means to a logical-level voltage; and a logic device for converting said logical-level voltage into a digital value;

wherein said output voltage of said second sampling means serves as a comparison signal for execution of the analog-to-digital conversion.

6. An ADC comprising;

first sampling means for sampling an analog input voltage by the use of a first holding capacitor and by the use of a first amplifier whose input and output terminals are short circuited for producing a bias voltage;

first amplifying means for amplifying the voltage difference between a sampled analog input voltage and a reference voltage;

second sampling means for sampling an output voltage of said first amplifying means by the use of a second holding capacitor and by the use of a second amplifier whose input and output terminals are short circuited for producing a bias voltage;

and second amplifying for amplifying the voltage difference between a sampled output voltage of said first amplifying means and a bias voltage produced by said first amplifying means and providing an output voltage;

logical-level amplifier means for amplifying the output voltage of said second amplifying means to a logical-level voltage; and a logic device for converting said logical-level voltage into a digital value;

wherein said output voltage of said second sampling means serves as a comparison signal for execution of the analog-to-digital conversion.

7. An ADC comprising;

first sampling means for sampling an analog input voltage to output the voltage difference between a sampled analog input voltage and a first reference voltage;

second sampling means for sampling said analog input voltage to output the voltage difference between a sampled analog input voltage and a second reference voltage;

first amplifying means for amplifying an output voltage of said first sampling circuit;

second amplifying means for amplifying an output voltage of said second sampling circuit;

third amplifying means for amplifying the intermediate voltage of said first and second sampling means and providing an output voltage;

logical-level amplifier means for amplifying the output voltage of said third amplifying means to a logical-level voltage; and a logic device for converting said logical-level voltage into a digital value;

wherein output voltages of said first, second, and third amplifying means serve as comparison voltages for execution of the analog-to-digital conversion.

8. An ADC comprising;

first sampling means for sampling an analog input voltage to output the voltage difference between a sampled analog input voltage and a first reference voltage;

second sampling means for sampling said analog input voltage to output the voltage difference between a sampled analog input voltage and a second reference voltage;

third sampling means for sampling an output voltage of said first sampling circuit;

fourth sampling means for sampling an output voltage of said second sampling circuit;

fifth sampling means for sampling the intermediate voltage between output voltages of said first and second sampling means and providing an output voltage;

logical-level amplifier means for amplifying the output voltage of said third amplifying means to a logical-level voltage; and a logic device for converting said logical-level voltage into a digital value;

wherein output voltages of said third, fourth, and fifth sampling means serve as comparison voltages for execution of the analog-to-digital conversion.

* * * * *